(12) United States Patent
Yamauchi

(10) Patent No.: US 7,386,285 B2
(45) Date of Patent: Jun. 10, 2008

(54) AUTOMATIC GAIN CONTROL ADAPTIVE FOR PLURAL MODULATION SCHEMES

(75) Inventor: Shigeki Yamauchi, Tokyo (JP)

(73) Assignee: Oki Electric Industry Co., Ltd. (JP)

( * ) Notice: Subject to any disclaimer, the term of this patent is extended or adjusted under 35 U.S.C. 154(b) by 431 days.

(21) Appl. No.: 11/237,862

(22) Filed: Sep. 29, 2005

(65) Prior Publication Data
US 2006/0077080 A1 Apr. 13, 2006

(30) Foreign Application Priority Data
Oct. 7, 2004 (JP) ............................ 2004-294628

(51) Int. Cl.
*H04B 17/02* (2006.01)
(52) U.S. Cl. .................... 455/136; 455/127.2; 455/138; 455/232.1; 455/239.1; 455/240.1; 455/245.1; 455/250.1
(58) Field of Classification Search ................ 455/136, 455/127.2, 138, 232.1, 239.1, 240.1, 245.1, 455/250.1
See application file for complete search history.

(56) References Cited

U.S. PATENT DOCUMENTS 7,295,826 B1 * 11/2007 Cook et al. .................. 455/323

2002/0160733 A1 * 10/2002 Kajita ..................... 455/234.1
2003/0207674 A1 * 11/2003 Hughes .................... 455/234.1
2004/0218576 A1   11/2004 Imagawa et al.

* cited by examiner

*Primary Examiner*—Sanh D. Phu
(74) *Attorney, Agent, or Firm*—Studebaker & Brackett PC; Donald R. Studebaker

(57) ABSTRACT

An AGC circuit controls LNA and VGA amplifiers such that a received signal is converted at a high speed with tracking errors prevented according to each modulation scheme. The AGC circuit generates LNA and VGA control signals controlling the LNA and VGA amplifiers, respectively. A digital signal, converted from the received signal, is calculated for a power value, on which scaling is performed by a scaling section to then be provided through an adder and a register to a control signal generator for generating the LNA and VGA control signals. The scaling section compares the power value with a target value to perform scaling with a scaling coefficient according to the sign of the comparison value so that an increase of the tracking error is avoided, thus preventing phenomena where the AGC control oscillates without convergence, thereby making it possible to attain the optimum automatic gain control.

20 Claims, 14 Drawing Sheets

Fig. 7

| RSSI SIGNAL DECISION | ERROR INFOR- MATION | DEMODU- LATION MODE | FIRST DEMODULATION MODE ASYNCHRONOUS INFORMATION | FIRST DEMODULATION MODE SYNC INFORMATION | SECOND DEMODULATION MODE SYNC INFORMATION | INFINITE AGC SETTING MODE | FIRST FINITE AGC SETTING MODE | SECOND FINITE AGC SETTING MODE |
|---|---|---|---|---|---|---|---|---|
| OFF | × | × | × | × | × | OFF | OFF | OFF |
| ON | × | 0 | OFF | × | × | OFF | ON | OFF |
| ON | × | 0 | ON | OFF | × | OFF | OFF | ON |
| ON | × | 1 | × | × | × | OFF | ON | OFF |
| ON | × | 2 | × | × | × | OFF | OFF | ON |
| ON | ON | 0 | × | × | OFF | ON | ON | OFF |
| ON | ON | × | × | ON | OFF | ON | ON | OFF |
| ON | ON | × | × | × | ON | OFF | OFF | ON |
| ON | ON | 1 | × | × | × | ON | ON | OFF |
| ON | ON | 2 | × | × | × | ON | OFF | ON |

Fig. 8

| RSSI SIGNAL DECISION | ERROR INFORMATION | DEMODULATION MODE | FIRST DEMODULATION MODE ASYNCHRONOUS INFORMATION | FIRST DEMODULATION MODE SYNC INFORMATION | SECOND DEMODULATION MODE SYNC INFORMATION | FIRST POWER SUPPLY SETTING | SECOND POWER SUPPLY SETTING | AGC LOOP STOP INFORMATION |
|---|---|---|---|---|---|---|---|---|
| OFF | x | x | x | x | x | OFF | OFF | x |
| ON | OFF | 0 | x | x | x | OFF | OFF | OFF |
| ON | OFF | 0 | x | x | x | ON | OFF | ON |
| ON | OFF | 0 | ON | x | x | OFF | OFF | OFF |
| ON | OFF | 0 | ON | x | x | OFF | ON | ON |
| ON | OFF | 1 | x | x | x | ON | OFF | OFF |
| ON | OFF | 1 | x | x | x | OFF | OFF | ON |
| ON | OFF | 2 | x | x | x | OFF | OFF | OFF |
| ON | OFF | 2 | x | x | x | OFF | ON | ON |
| ON | ON | 0 | x | OFF | OFF | ON | OFF | x |
| ON | ON | 0 | x | ON | OFF | ON | OFF | x |
| ON | ON | 0 | x | OFF | ON | OFF | OFF | OFF |
| ON | ON | 1 | x | x | x | OFF | ON | ON |
| ON | ON | 2 | x | x | OFF | OFF | OFF | x |
| ON | ON | 2 | x | x | ON | OFF | OFF | OFF |
| ON | ON | 2 | x | x | ON | OFF | ON | ON |

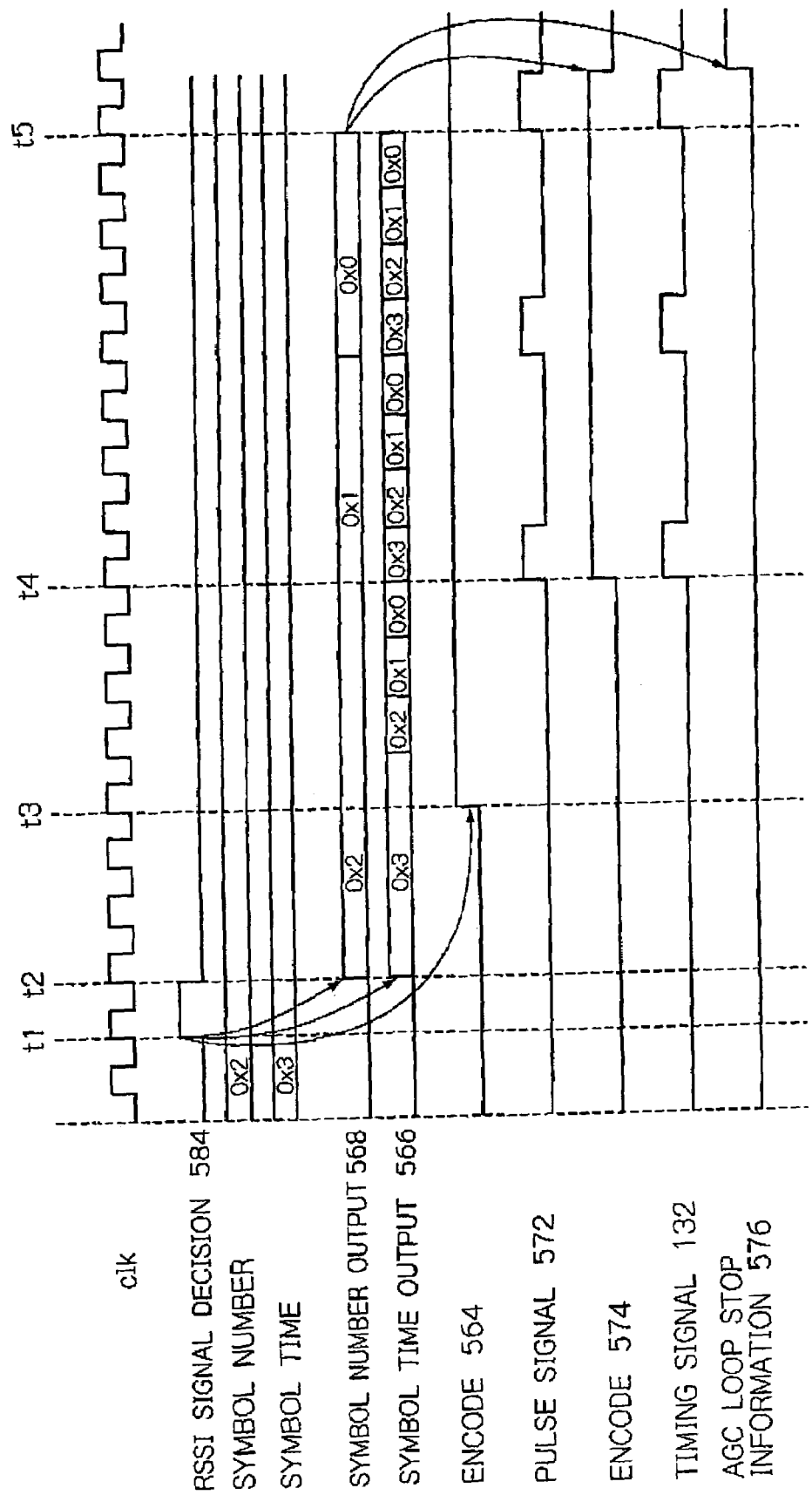

Fig. 12

| RECEIVED INPUT LEVEL | LNA | VGA | BASEBAND SIGNAL |
|---|---|---|---|
| 0 | 0 | 0 | 0 |
| -10 | 0 | 10 | 0 |
| -20 | 0 | 20 | 0 |
| -30 | 30 | 0 | 0 |
| -40 | 30 | 10 | 0 |
| -50 | 30 | 20 | 0 |
| -60 | 30 | 30 | 0 |
| -70 | 30 | 40 | 0 |
| -80 | 30 | 50 | 0 |
| -90 | 30 | 60 | 0 |
| -100 | 30 | 70 | 0 |

AUTOMATIC GAIN CONTROL ADAPTIVE FOR PLURAL MODULATION SCHEMES

BACKGROUND FOR THE INVENTION

1. Field of the Invention

The invention relates to an automatic gain control (AGC) circuit and a method which adjust a received signal according to a start-up mode such that the received signal has its amplitude correspond to a baseband signal level determined from a bit error rate (BER) characteristics of a demodulator.

2. Description of the Background Art

Traditionally, the automatic gain control circuit and method have been known to be applicable to a receiver which receives a signal modulated by a modulation scheme such as a packet wireless transmission scheme, and to be able to adjust the received signal such that the received signal has its amplitude correspond to a baseband signal level determined from the BER characteristics of the demodulator.

As shown in FIG. 11, for example, the receiver 10 has a low-nose amplifier (LNA) 28 and a variable-gain amplifier (VGA) 30 for AGC-controlling a received signal 102 input from an antenna 12, which are interconnected as illustrated. I and Q component analog-to-digital (A/D) converters (ADCs) 32 and 34 then convert the AGC-controlled analog signal to a corresponding digital signal. In response to the digital signal, an automatic gain control circuit 700 automatically controls the gain such that the digital signal has its amplitude level expected by the baseband signal processor.

The low-noise amplifier and variable-gain amplifier 28 and 30 adjust the received signal 102 and provide them to the I and Q component A/D converters 32 and 34 in the form of I and Q components 106 and 108, respectively. The I and Q component A/D converters 32 and 34 then generate the I and Q component digital received signals 110 and 112, respectively, and provide them to the automatic gain control circuit 700.

The AGC circuit 700 has a power value operator 18 which operates the power of the digital received signals 110 and 112, to produce an input signal 114. The input signal 114 is representative of a power value determined by the expression $(I^2+Q^2)^{1/2}$, for example, where I represents the I component digital received signal 110, and Q represents the Q component digital received signal 112.

The input signal 114 is provided to a scaling section 20 including an operator 36 and a multiplier 702. The operator 36 first subtracts a target value 146 from the input signal 114 to obtain a difference from the subtraction. The multiplier 702 then multiplies the difference by a scaling coefficient 712, and outputs a result 714 from the scaling. The multiplier 702 performs the same scaling process regardless of the sign of the input signal 114. When the scaling coefficient 712 is $2^{-1}$, for example, the input signal 114, when representing a value of 8, will cause a scaling result 714 of 4, and the input signal 114, when representing a value of −8, will cause a scaling result 714 of −4.

The AGC circuit 700 usually performs the AGC control with some modulation scheme assumed. The scaling section 20 is adapted, in order to prevent the AGC tracking error according to each of a plurality of modulation schemes, to make the scaling coefficient correspond to any one of the modulation schemes, or to fix, when adapted to two modulation schemes, for example, the scaling coefficient to a midpoint between two scaling coefficients respectively appropriate to the two modulation schemes.

The scaling result 714 is then provided to an adder 22. The adder 22 adds the scaling result 714 to the immediately preceding previous data 128 registered in a register 24. The addition result 30 is provided to a control-signal generating section 26.

The control-signal generating section 26 includes a register 46, a timing generator 48, a comparator 50, a selector 52, and an operator 54. The register 46 first stores the addition result 130. In response to an update-timing signal 132 from the timing generator 48, the register 46 outputs the result 130 to the comparator 50 and operator 54 as control data 134. The comparator 50 compares the control data 134 with a predetermined comparison value 136. The comparator 50 then provides the low-noise amplifier 28 and selector 52 with an LNA control signal 138 representing whether or not the control data 134 is less than the comparison value 136. In response to the LNA control signal 138, the selector 52 outputs either one of zero data 140 and the comparison value 136 to the operator 54 as selected data 142. The operator 54 subtracts the selected data 142 from the control data 134 to create a VGA control signal 144, and outputs it to the variable-gain amplifier 30.

In this way, the AGC circuit 700 can use a scaling coefficient adapted to the modulation scheme of the received signal to perform the low-noise amplification and variable-gain amplification on the received signal to accomplish automatic gain control.

U.S. patent application publication No. US 2004/0218576 A1 filed in the name of Imagawa et al., discloses a receiver which switches a selector switch according to a communication scheme, CDMA (Code Division Multiple Access) or TDMA (Time Division Multiple Access). The receiver thus selects an output signal from the variable-gain amplifier when receiving the CDMA signal, and selects an output signal from the second orthogonal mixer when receiving the TDMA signal. The second orthogonal mixer converts the output signal from the variable-gain amplifier to a corresponding baseband signal. The receiver can thus suitably adapt itself to any of a plurality of communication schemes without having to include any special offset-voltage eliminator.

In the AGC circuit 700 as shown in FIG. 11, however, regardless of what value the scaling section 20 sets the scaling coefficient 712 to, it is impossible to attain the maximum accuracy of the I and Q component A/D converters 32 and 34 appropriate for a specific modulation scheme.

The receiver taught in Imagawa et al., would, when adapted to a plurality of modulation schemes in the automatic gain controlling of the received signal, need to arrange a large number of circuits and wiring lines in a complex manner.

A type of received signal such as a continuous signal and a packet signal conventionally requires a longer AGC training period of time. The recent high-speed packet transmission has, however, a shorter training period of time for the purpose of its high-speed transmission feature, and thus requires AGC tracking in a shorter time period to adjust the output level in the I and Q component A/D converters. A smaller scaling coefficient can provide a higher speed AGC convergence, while it can also provide more AGC tracking errors. Particularly, in the case where the result from the control on the low-noise and variable-gain amplification changes dynamically, the automatic gain control may not converge but oscillate within a short time period.

FIG. 12, for example, shows how the result from the LVA and VGA control changes dynamically. As shown, when the baseband signal is set to the zero level and the received input level changes from −30 dBm to −20 dBm, the LNA control signal switches from its ON state to its OFF state to change the LNA gain value from 30 dB to 0 dB, and the VGA gain value changes from 0 dB to 30 dB. It can be understood that a larger gain change occurs during the transitional period of that changing point than other changing points.

In the receiver 10 as shown in FIG. 11, the radio-frequency (RF) circuit 14 including the low-noise amplifier 28 and variable-gain amplifier 30 processes the received signal 102 by allowing a first mixer, not shown, to perform a frequency conversion after the process in the low-noise amplifier 28 but before the process in the variable-gain amplifier 30. The low-noise amplifier 28 is switched between its ON and OFF states to prevent the distortion in the first mixer. Because the ON/OFF switching of the low-noise amplifier 28 varies the gain, however, a received signal with a level which varies the control of the low-noise amplifier 28 may increase the tracking error.

The baseband signal is calculated from the relationship: baseband signal=received input level+LNA gain value+ VGA gain value. The LNA and VGA gain values need to be adjusted to keep the baseband signal constant within a supposed received-level range. Particularly, the baseband signal has its characteristics degraded by the distortion in the first mixer. It is difficult, however, to adjust the low-noise amplifier for no distortion.

The conventional AGC circuit needs to always perform the automatic gain control during receiving a signal, thereby consuming a large amount of current. Particularly, in the packet transmission, the automatic gain control is active even in a time period in which no signal is received, thereby increasing the current consumption.

SUMMARY OF THE INVENTION

It is an object of the present invention to provide an automatic gain control (AGC) circuit and method which can, according to a baseband signal level determined from the BER characteristics of a demodulator, achieve the maximum accuracy of I and Q component A/D converters according to each of a plurality of the modulation schemes, and particularly, can keep the amplitude level when the control on the low-noise and variable-gain amplification of an RF circuit dynamically varies to convert a received signal at a high-speed with tracking errors minimized.

It is another object of the present invention to provide an automatic gain control circuit and method which operate with power consumption reduced.

The present invention provides an automatic gain control circuit applicable to a receiver including, an adjustment circuit, which includes a low-noise amplifier and a variable-gain amplifier, for adjusting amplification of a received signal in response to a low-noise amplification control signal and a variable-gain amplification control signal which are respectively input to the amplifiers as adjustment control signals, and a plurality of demodulators which demodulate the adjustment result of the adjustment circuit respectively for a plurality of modulation schemes. The automatic gain control circuit comprises: a scaling circuit for comparing the adjustment result of the adjustment circuit with a predetermined target value and using the comparison result and a scaling coefficient to perform a scaling; an adder for adding the scaling result of the scaling circuit to a delayed immediately-preceding control voltage to generate a control voltage; and a control signal generator, which comprises a timing generator for generating an update-timing signal, for generating the low-noise amplification control signal and the variable-gain amplification control signal from the control voltage in response to the update-timing signal. The scaling circuit determines a first scaling coefficient for positive value and a second scaling coefficient for a negative value as the scaling coefficient according to each of the plurality of modulation schemes, determines a sign of the comparison result, uses the first scaling coefficient for operation when the sign is positive, and the second scaling coefficient for operation when the sign is negative.

The present invention also provides an automatic gain control method applicable to a receiver including an adjustment circuit, which includes a low-noise amplifier and a variable-gain amplifier. The method comprises the step of adjusting amplification of a received signal in response to a low-noise amplification control signal and a variable-gain amplification control signal which are respectively input to the amplifiers as adjustment control signals. The receiver further includes a plurality of demodulators which demodulate the adjustment result of the adjustment step respectively for a plurality of modulation schemes. The method further comprises; a scaling step of comparing the adjustment result of the adjustment circuit with a predetermined target value and using the comparison result and a scaling coefficient to perform operation; an addition step of adding the scaling result of the scaling step to a delayed immediately-preceding control voltage to generate a control voltage; and a control signal generating step, which comprises a timing generating substep of generating an update-timing signal, of generating the low-noise amplification control signal and the variable-gain amplification control signal from the control voltage in response to the update-timing signal. The scaling step determines a first scaling coefficient for a positive value and a second scaling coefficient for a negative value as the scaling coefficient according to each of the plurality of modulation schemes, determines a sign of the comparison result, uses the first scaling coefficient for operation when the sign is positive and the second scaling coefficient for operation when the sign is negative.

According to one aspect of the invention, during a predetermined stop period after the update-timing signal is generated, the addition step may stop addition and generate the control voltage only from the scaling result.

According to another aspect of the invention, the control signal generating step may comprise: an storing substep of storing the control voltage and outputting the control voltage in response to the update timing; a comparison substep of comparing the control voltage output from the storing step with a predetermined comparison value to generate the low-noise amplification control signal; a decision substep of deciding the low-noise amplification control signal and outputting a first operation coefficient according to a decision result; and an operation substep of subtracting the first operation coefficient from the control voltage which is output from the storing substep to calculate out the variable-gain amplification control signal.

In accordance with one aspect of the invention, the comparison substep may turn ON the low-noise amplification control signal when the control voltage output from the storing substep is equal to or more than the predetermined comparison value, and otherwise turn OFF the low-noise amplification control signal, the decision substep outputting the predetermined comparison value as the first operation coefficient when the low-noise amplification control signal is in its ON state, and outputting data indicating zero as the first operation coefficient when the low-noise amplification control signal is in its OFF state.

In accordance with another aspect of the invention, the comparison substep may comprise a filter substep of using the control voltage output from the storing substep and the delayed immediately-preceding filter result to perform filtering, the comparison substep comparing a filtering result of the filter substep with the predetermined comparison value and generating the low-noise amplification control signal.

In the method, the filter substep may use an IIR (Infinite Impulse Response) filter.

According to one aspect of the invention, the IIR filter substep may stop an IIR filtering during a predetermined filtering-stop period set by an upper layer from when the timing generating substep starts to generate the update-timing signal.

According to another aspect of the invention, the comparison substep may comprise a hysteresis substep of using a filtering result of the filter substep, an upper-limit threshold value and a lower-limit threshold value to perform a hysteresis processing on the low-noise amplification control signal.

According to a further aspect of the invention, the hysteresis substep may stop the hysteresis processing during a predetermined hysteresis processing stop period set by an upper layer from when the timing generating substep starts to generate the update-timing signal.

According to a still further aspect of the invention, the hysteresis substep may turn ON the low-noise amplification control signal and outputs it, when the low-noise amplification control signal is in its OFF state and the filtering result of the filter substep exceeds the upper-limit threshold value, the hysteresis substep turning OFF the low-noise amplification control signal and outputting it, when the low-noise amplification control signal is in its ON state and the filtering result of the filter substep is lower than the lower-limit threshold value, and, otherwise, the hysteresis substep directly outputting the low-noise amplification control signal.

In accordance with one aspect of the invention, the control signal generating step may comprise a compensation substep of determining a change between the low-noise amplification control signal output from the hysteresis substep and a delayed immediately preceding low-noise amplification control signal, and outputting a second operation coefficient according to the decision result, the operation substep subtracting the first operation coefficient from and adding the second operation coefficient to the control voltage output from the storing substep, and calculating out the variable-gain amplification control signal.

In accordance with another aspect of the invention, the compensation substep may output as the second operation coefficient predetermined compensation data when the low-noise amplification control signal is changed from in its ON state to its OFF state, and otherwise data indicating zero.

The method according to one aspect of the invention, further comprises: a demodulator power-supply management step of controlling power supply of the plurality of demodulators; an RSSI signal decision step of determining a RSSI (Receiving Signal Strength Indicator) signal provided from the low-noise amplifier using a predetermined expected value, and generating an RSSI decision signal indicating whether or not the RSSI signal detected is equal to or more than the predetermined expected value; and an AGC setting control step of determining an AGC (Automatic Gain Control) setting corresponding to any one of the plurality of demodulators, and controlling the timing generating substep and the demodulator power-supply management step according to the AGC setting, and generating a timing generation control signal according to the RSSI decision signal, and controlling the timing generating substep in response to the timing generation control signal, the timing generating substep generating an update-timing signal according to the timing generation control signal and the AGC setting, the timing generating substep generating, only when the RSSI signal decision step detects the RSSI signal equal to or more than the predetermined expected value, the update-timing signal of a fixed-cycle signal according to the modulation scheme of the demodulator corresponding to the AGC setting to output it.

According to another aspect of the invention, the AGC setting control step may provide an addition-stop period to the timing generating substep, the timing generating substep generating the addition-stop signal for stopping the addition during the addition-stop period after the update-timing signal is generated, and providing it to the addition step, the addition step stopping the addition in response to the addition-stop signal.

According to still another aspect of the invention, when the RSSI signal is equal to or more than the predetermined expected value, the RSSI signal decision step may turn ON the RSSI decision signal and output it to the AGC setting control step, and, otherwise, the RSSI signal decision step may turn OFF the RSSI decision signal and output it to the AGC setting control step, the AGC setting control step, when the RSSI decision signal is in its ON state, turning ON the timing generation control signal and providing the symbol time and symbol number to the timing generating substep as the AGC setting, the AGC setting control step, when the RSSI decision signal is in its OFF state, turning OFF the timing generation control signal and providing the symbol time and symbol number to the timing generating substep as the AGC setting, the timing generating substep performing, when the timing generation control signal is in its ON state, integration on the reference operational clock signal for a number of symbols at a time interval according to a symbol time to generate the update-timing signal, the timing generating substep stopping, when the timing generation control signal is in its OFF state, generation of the update-timing signal.

According to a further aspect of the invention, the AGC setting control step may determine an AGC setting which provides finite or infinite generation of the update-timing signal corresponding to any one of the plurality of demodulators, the AGC setting control step determining, when providing finite generation, the AGC setting as a finite AGC setting which includes a finite symbol number and a symbol time for the corresponding demodulator, the AGC setting control step determining, when providing infinite generation, the AGC setting as an infinite AGC setting which includes a symbol number indicating an infinite value, and an average of finite symbol times for the plurality of demodulators or a finite symbol time for any one of the plurality of demodulators.

According to a still further aspect of the invention, the AGC setting control step may determine the AGC setting according to a plurality of demodulation modes respectively corresponding to the plurality of demodulators, and according to a plurality of pieces of synchronous information and asynchronous information provided from the plurality of demodulators.

In accordance with one aspect of the invention, the RSSI signal decision step may comprise an error decision substep of turning ON error information according to a setting from the upper layer and providing it to the AGC setting control step, when the timing generating substep starts to generate the update-timing signal and the synchronous information is provided from all of the demodulators, the error decision substep forcefully turning ON the error information according to the setting from the upper layer, the AGC setting control step determining the AGC setting which provides an infinite generation of the update-timing signal only when the error information is in its ON state.

In accordance with another aspect of the invention, the error decision substep may turn OFF the error information and provide it to the AGC setting control step, when an energy value obtained by averaging of the RSSI signal is less than a predetermined threshold value, and, otherwise, the error decision substep may decide an error, turn ON the error information, and provide it to the AGC setting control step, the AGC setting control step determining the AGC setting as the infinite AGC setting only when the error information is in its ON state.

In accordance with still another aspect of the invention, the scaling step may comprise a condition setting substep of changing the predetermined target value and the scaling coefficient, according to the plurality of demodulation modes and the error information provided from the AGC setting control step.

In accordance with yet another aspect of the invention, when the error information is in its ON state, and when the AGC control value is within a predetermined range set by an upper layer, the AGC setting control step may keep the power supply of the demodulator OFF until the AGC control value is changed to an excess level.

When the update-timing signal has its cycle shorter, the compensation value is largely affected by the varied level of the level change transitional period of the low-noise and variable-gain amplifiers. The method according to the present invention can thus stop the addition during a predetermined period set by an upper layer of the communications system from when the update-timing signal is generated.

In the automatic gain control circuit according to the present invention, the scaling changes the scaling coefficient according to the sign of the comparison result between the received signal and target value, and calculates the LNA and VGA control signals. Even when the high-speed AGC convergence is performed particularly in the case where the result from LNA and VGA control dynamically changes, the tracking error is prevented from increasing, and a phenomena is avoided where the AGC control oscillates without convergence, in the entire input ranges, thereby making it possible to attain the more optimum automatic gain control.

In the automatic gain control circuit according to the present invention, the control signal generator may comprise a hysteresis circuit or an IIR filter which reduces the tracking error which would otherwise be caused by the gain variation due to the ON/OFF switching of the low-noise amplifier, thereby achieving the high-speed AGC convergence operation in the packet transmission. The control signal generator may comprise a compensation circuit which compensates the signal loss during the LNA control signal changing from its ON state to OFF.

In the automatic gain control circuit according to the present invention, the AGC setting controller sequentially selects one of the plurality of demodulators and performs the automatic gain control on it, thereby making it possible to reduce the current consumption and to improve the characteristics to perform AGC settings suited to each demodulator. In an environment which causes an adverse effect such as interfering noise, when an invalid signal is received, the RSSI signal and error decisions allow the automatic gain control and other circuits to be halt from operation, thereby reducing the power consumed in the entire device.

In the automatic gain control circuit according to the present invention, the scaling section can set the target value and scaling coefficient suited to each demodulator to decrease the tracking error.

Stopping the addition during a predetermined stop period from when the update-timing signal is generated can increase accuracy in compensation of the low-noise and variable-gain amplifiers.

BRIEF DESCRIPTION OF THE DRAWINGS

The objects and features of the present invention will become more apparent from consideration of the following detailed description taken in conjunction with the accompanying drawings in which:

FIG. 7 illustrates a table indicative of the relation of the AGC setting modes in the AGC setting controller in the embodiment shown in FIG. 6;

FIG. 8 illustrates a table indicative of the relation of the power supply settings of the first and second demodulators in the AGC setting controller in the embodiment shown in FIG. 6;

FIG. 9 is a timing chart useful for understanding the operation of the AGC circuit in the embodiment shown in FIG. 6;

FIG. 12 illustrates a table indicative of the relation of the gain values in the low-noise and variable-gain amplifiers in the receiver;

DESCRIPTION OF PREFERRED EMBODIMENTS

Figure 1:
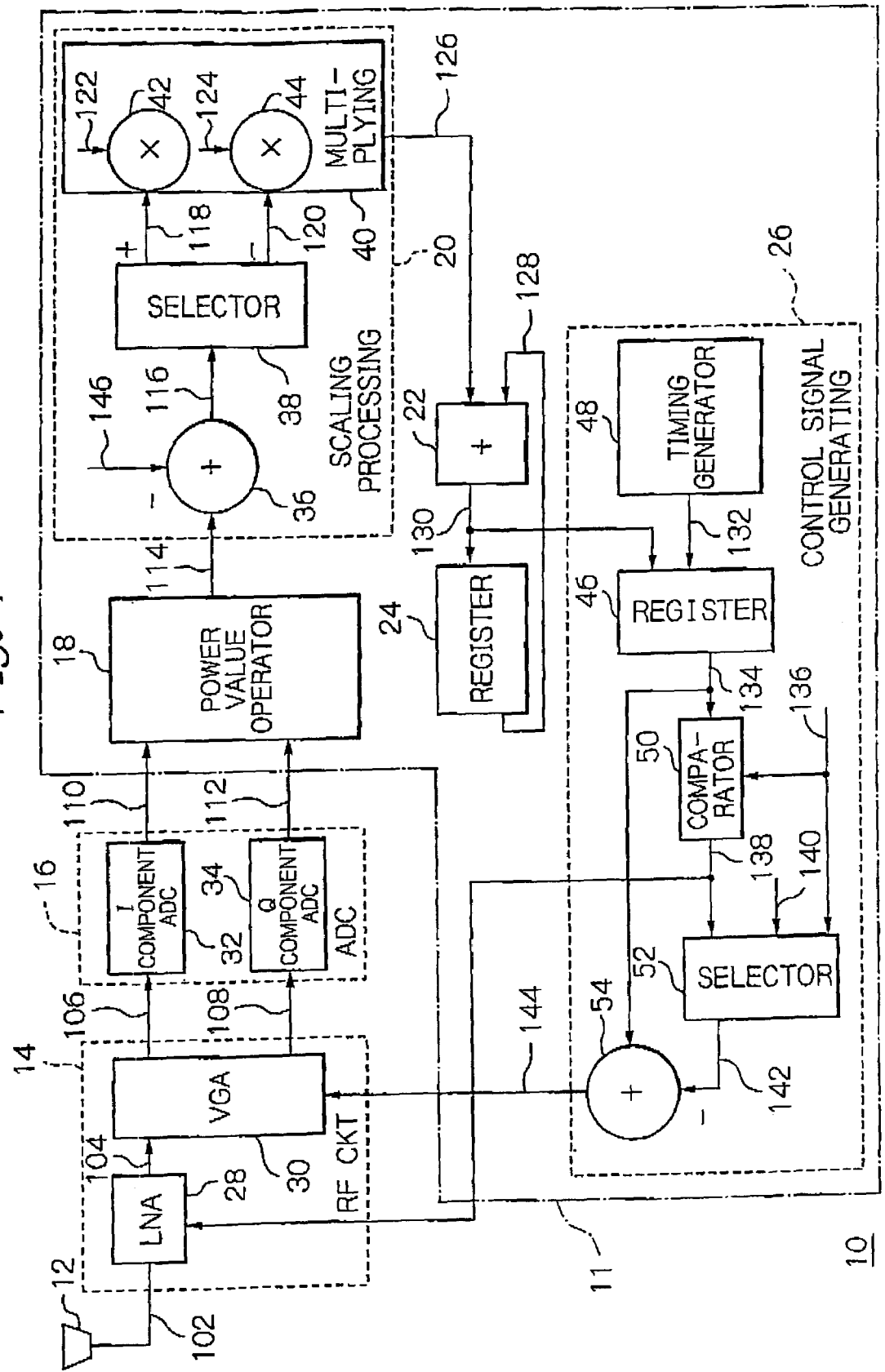
FIG. 1 is a schematic block diagram showing a preferred embodiment of the AGC circuit according to the present invention applied to a receiver.

In the following, the preferred embodiments of the AGC circuit according to the present invention will be described in detail with reference to the accompanying drawings. The AGC circuit 11, according to the present invention, can apply, for example, to the receiver 10 as shown in FIG. 1. In the receiver 10, the antenna 12 receives an electromagnetic wave to output a signal 102. In the following, signals are designated with reference numerals of connections on which the signals appear. The signal 102 is then adjusted by the RF circuit 14 including the low-noise amplifier (LNA) 28 and variable-gain amplifier (VGA) 30, and converted by the analog-to-digital converter (ADC) section 16 to digital signals 110 and 112. The digital signals 110 and 112 are then provided to the power value operator 18 which calculates the power value 114. On the signal 114, the scaling section 20 performs scaling. A signal 126 thus scaled is provided through the adder 22 and register 24 to the control signal generator 26 which generates a control signal 138 and a VGA control signal 144. The LNA control signal 138 controls the low-noise amplifier 28, and the VGA control signal 144 controls the variable-gain amplifier 30. This can keep the received signal 102 at the amplitude level as expected by the baseband section, not specifically shown. Note that from the description and drawings omitted are components which do not contribute greatly to the understanding of the present invention.

In this illustrative embodiment, the low-noise amplifier 28 in the RF circuit 14 can, in response to the provided LNA control signal 138, amplify the received signal 102 and output an LNA amplification signal 104. If, for example, the LNA control signal 138 is in its ON, or active, state, the low-noise amplifier 28 increases the received signal 102, whereas if the signal 138 is in its OFF, or inactive, state, the low-noise amplifier 28 decreases the received signal 102. The low-noise amplifier 28 increases the signal 102 by 25 dB when the signal 138 is in its ON state, and decreases it by 3 dB when the signal 138 is in its OFF state, for example.

The variable-gain amplifier 30 in the RF circuit 14 has its amplification gain variable and controls it in response to the VGA control signal 144. The variable-gain amplifier 30 amplifies the LNA amplification signal 104 at a controlled gain and outputs the I and Q component amplification signals 106 and 108.

The ADC section 16 in this embodiment has the I and Q component A/D converters 32 and 34 interconnected as shown. The I component A/D converter 32 converts the I component amplification signal 106 into the I component digital signal 110 corresponding thereto. The Q component A/D converter 34 converts the Q component amplification signal 108 into the Q component digital signal 112 corresponding thereto.

The power value operator 18 in this embodiment operates in power the digital signals 110 and 112, and calculates the scaling input signal 114. The power value operator 18 may be adapted to operate according to the expression, $(I^2+Q^2)^{1/2}$, where I and Q represent digital signals 110 and 112, respectively.

The scaling section 20 performs the scaling on the scaling input signal 114. The scaling processing section 20 has the operator 36, a selector 38, and a multiplying section 40 which are interconnected as depicted. The operator 36 may be adapted to compare the input signal 114 with a predetermined target value 146, e.g., subtract the target value 146 from the input signal 114, and output the difference therebetween in the form of comparison value 116. The selector 38 may be adapted to determine the comparison value 116 and provide an output to the multiplying section 40 depending on the determined result.

In this embodiment, the multiplying section 40 has a multiplier for a positive value, or positive-value multiplier, 42 and a multiplier for a negative value, or negative-value multiplier, 44. The selector 38 decides which multiplier can perform more optimally the scaling of the comparison value 116. The selector 38 may be adapted to decide whether or not the comparison value 116 is less than zero. The selector 38 may be adapted to transfer, when the comparison value 116 is positive, the comparison value 116 on its comparison value output 118 to the positive-value multiplier 42, and, when the comparison value 116 is negative, the comparison value 116 on its comparison value output 120 to the negative-value multiplier 44. The selector 38 may be adapted to determine the sign bit of the comparison value 116 to decide whether the value 116 is positive or negative.

The positive-value multiplier 42 in the multiplying section 40 multiplies the comparison value 118 by a scaling coefficient for positive value 122 and outputs the scaling result 126. The negative-value multiplier 44 in the multiplying section 40 multiplies the comparison value 120 by a scaling coefficient for a negative value 124 and outputs the scaling result 126.

In this embodiment, depending upon a specific modulation scheme, particularly according to the preamble time period prescribed and propagation characteristics of the scheme, the multiplying section 40 sets the scaling coefficient for positive value 122 and the scaling coefficient for a negative value 124 in consideration of the AGC convergence time and fading and the white time. When the operator 36 is adapted to subtract the target value 146 from the input signal 114, the multiplying section 40 sets the scaling coefficients such that the scaling coefficient for positive value 122 is larger than the scaling coefficient for a negative value 124. By contrast, when the operator 36 is adapted to subtract the input signal 114 from the target value 146, the multiplying section 40 sets the scaling coefficients such that the scaling coefficient for positive value 122 is smaller than the scaling coefficient for a negative value 124.

In this embodiment, with the scaling coefficient for positive value 122 and scaling coefficient for a negative value 124 set as described above, in a predetermined input level range, e.g., at input levels higher than the dynamic level at which the gain values in the low-noise amplifier 28 and variable-gain amplifier 30 dynamically change, the tracking error may slightly increase. Such a situation can be prevented where the tracking error correspondingly increases in all input ranges. At the dynamic level, the tracking error slightly increases, but it does not arrive at a level at which the automatic gain control oscillates without convergence.

For example, the multiplying section 40 preferably sets the scaling coefficient for positive value 122 and scaling coefficient for negative value 124 to the values of $2^0$, $2^{-1}$, $2^{-2}$, .... For example, when the comparison value 116 is equal to a value of +511 (DEC) and the scaling coefficient for positive value 122 to a value of $2^{-1}$, the multiplying section 40 operates with a one-bit shift for obtaining a value of +255. When the comparison value 116 is equal to a value of −127 (DEC), where (DEC) denotes decimal indication, and the scaling coefficient for negative value 124 is equal to a value of $2^{-3}$, the multiplying section 40 operates with a three-bit shift for obtaining a value of −15.

For different modulation schemes to be dealt with in the baseband section, the multiplying section 40 may change the scaling coefficient for positive value 122 and scaling coefficient for negative value 124. According to the detected results in the baseband section, the multiplying section 40 may have the scaling coefficients adaptive to the type of modulation signal. The multiplying section 40 may also be adapted to change the scaling value depending on the analog characteristics such as the transient characteristics due to the analog control in the low-noise amplifier 28 and variable-gain amplifier 30.

With the multiplying section 40, having the settings of the scaling coefficient for positive value 122 and scaling coefficient for negative value 124, a faster convergence may be accomplished by decreasing the expected amplitude level. Excessively smaller coefficients may, however, degrade the AGC control accuracy, and more specifically the AGC control set value may be unstable like turbulent waves. For the white noise, larger scaling coefficients can usually stabilize the amplitude value. It may, however, take a longer time to stabilize it and it may thus be impossible to converge the amplitude in a shorter period of time.

The adder 22 in this embodiment is adapted for adding the scaling result 126 from the scaling section 20 to the immediately preceding previous data 128 read out from the register 24. The adder 22 outputs the addition result to the control signal generator 26 in the form of control signal 130. The adder 22 also functions as storing the result in the register 24 as the previous data. The adder 22 may preferably include overflow and underflow processing.

During the transitional period from when the gain values in the low-noise amplifier 28 and variable-gain amplifier 30 are changed to when the analog signal is of the expected level, it is preferable that the adder 22 does not perform the addition of the scaling result 126 but merely stores the result 126 into the register 24 functioning as storage means.

The control signal generator 26 includes the register 46, timing generator 48, comparator 50, selector 52, and operator 54. The generator 26 is adapted to receive the control signal 130 from the adder 22, and output the LNA and VGA control signals 138 and 144 which are interconnected as illustrated.

The register 46 is adapted to store the control signal 130 from the adder 22, and output, in response to the update-timing signal 132 supplied from the timing generator 48, the control data 134 to the comparator 50 and operator 54. The timing generator 48 is adapted for generating the update-timing signal 132 defining the update timing of the LNA and VGA control signals 138 and 144.

The comparator 50 is adapted to compare the control data 134 with a predetermined comparison value 136 to provide the comparison result to the low-noise amplifier 28 as the LNA control signal 138. In this embodiment, the comparator 50 turns the LNA control signal 138 ON, or to its high level, when the control data 134 is equal to or more than the comparison value 136. The comparator 50 turns the LNA control signal 138 OFF, or to its low level, when the control data 134 is less than the comparison value 136. The comparator 50 is also adapted to output the LNA control signal 138 to the selector 52.

The selector 52 is responsive to the LNA control signal 138 to select either the predetermined comparison value 136 or zero data 140 indicating zero, and output it as the selected data 142. In this embodiment, the selector 52 selects the predetermined comparison value 136 when the LNA control signal 138 is turned ON, and selects the zero data 140 when the LNA control signal 138 OFF.

The operator 54 is adapted for subtracting the selected data 142 provided from the selector 52 from the control data 134 provided from the register 46. The operator 54 provides the operation result to the variable-gain amplifier 30 as the VGA control signal 144.

A description will be given below of the operation of the AGC circuit 11 in this embodiment. In this illustrative embodiment, the antenna 12 in the receiver 10 first receives the received signal 102 and provides it to the low-noise amplifier 28 in the RF circuit 14. If the low-noise amplifier 28 receives the LNA control signal 138 which is in its ON state, the low-noise amplifier 28 performs the low-noise amplification on the received signal 102. The low-noise amplifier 28 then creates the LNA amplification signal 104, which is in turn provided to the variable-gain amplifier 30 in the RF circuit 14. In response to the VGA control signal 144, the variable-gain amplifier 30 performs the variable-gain amplification on the LNA amplification signal 104. The variable-gain amplifier 30 then provides the I component amplification signal 106 to the I component A/D converter 32 in the ADC section 16. The variable-gain amplifier 30 also provides the Q component amplification signal 108 to the Q component A/D converter 34 in the ADC section 16.

The I component A/D converter 32 converts the analog I component amplification signal 106 into the I component digital signal 110 corresponding thereto. The Q component A/D converter 34 converts the analog Q component amplification signal 108 into the Q component digital signal 112 corresponding thereto.

To allow the RF circuit 14 to make the AGC control resultantly corresponding to the amplitude level expected by the baseband section, the AGC circuit 11 uses the I and Q component digital signals 110 and 112 to generate the LNA and VGA control signals 138 and 144 for the next AGC control.

In the AGC circuit 11 in this preferred embodiment, the power value operator 18 first receives and operates in power the digital signals 110 and 112 to provide the scaling section 20 with the operation result in the form of scaling input signal 114.

In the scaling section 20, the operator 36 first receives the scaling input signal 114, compares it with the target value 146, and calculates the comparison value 116. The comparison value 116 may be the scaling input signal 114 minus the target value 146. The target value 146 may be a value corresponding to the amplitude level as expected by the baseband section, which value may be a predetermined threshold value.

The selector 38 then receives the comparison value 116. The selector 38 decides whether the comparison value 116 is positive or negative. If the value 116 is positive, the value 116 is provided as a comparison value 118 to the positive-value multiplier 42 in the multiplying section 40. If the value 116 is negative, the value 116 is provided as a comparison value 120 to the negative-value multiplier 44 in the multiplying section 40.

The positive-value multiplier 42 multiplies the comparison value 118 by the scaling coefficient 122 for a positive value and outputs the multiplication result as the scaling result 126. The negative-value multiplier 44 multiplies the comparison value 120 by the scaling coefficient 124 for a negative value and outputs the multiplication result as the scaling result 126.

The adder 22 receives the scaling result 126. At the same time, the adder 22 reads out the immediately preceding previous data 128 from the register 24. The adder 22 adds the scaling result 126 to the previous data 128. The adder 22 inputs the addition result to the control signal generator 26 in the form of control signal 130. The register 24 stores the control signal 130 for the next addition process in the adder 22.

The adder 22 may, for example, interrupt the addition during a predetermined addition-halting period set by the upper layer and starting from when the timing generator 48 first generates the update-timing signal. During the addition-halting period, the adder 22 directly outputs the scaling result 126 in the form of control signal 130, without adding the scaling result 126 to the previous data 128.

The register 46 first stores the control signal 130 inputted in the control signal generator 26. In response to the update-timing signal 132 from the timing generator 48, the register 46 provides the stored control signal to the comparator 50 as the control data 134. The register 46 also provides the control data 134 to the operator 54.

The comparator 50 then compares the control data 134 with the predetermined comparison value 136. If the control data 134 is larger than the predetermined comparison value 136, the comparator 50 generates the LNA control signal 138 which is in its ON, enabled, state and provides it to the low-noise amplifier 28. If the control data 134 is smaller than the predetermined comparison value 136, the comparator 50 generates the LNA control signal 138 of OFF, or disabled, condition and provides it to the low-noise amplifier 28. The comparator 50 also provides the LNA control signal 138 to the selector 52. The selector 52 also receives the predetermined comparison value 136. The predetermined comparison value 136 may be set in advance, or may be settable by the user.

The selector 52 outputs the predetermined comparison value 136 as the selected data 142 when the LNA control signal 138 is in its ON state. The selector 52 outputs the zero data of value zero as the selected data 142 when the LNA control signal 138 is in its OFF state.

The operator 54 receives the selected data 142. The operator 54 subtracts the selected data 142 from the control data 134 provided from the register 46 to produce the VGA control signal 144. The operator 54 provides the VGA control signal 144 to the variable-gain amplifier 30.

As described above, in this embodiment, the scaling process can modify the scaling coefficient according to the sign of the comparison value 116 which is the difference between the input signal and target value 146, before calculating out the LNA and VGA control signals 138 and 144. A more optimum automatic gain control can thus be provided.

Figure 2:
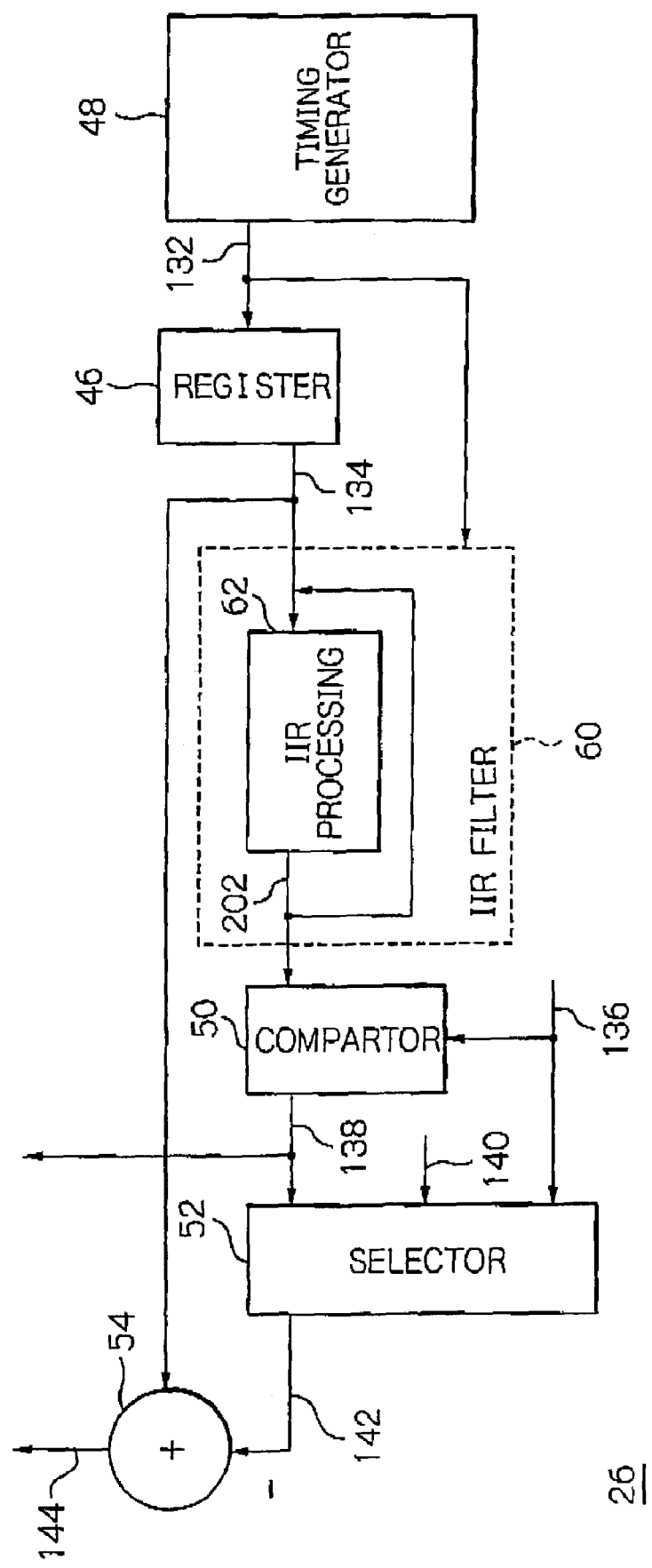
FIG. 2 is a schematic block diagram showing a control signal generator in an alternative embodiment of the AGC circuit according to the present invention.

FIG. 2 shows an alternative embodiment in which the AGC circuit 11 includes an infinite impulse response (IIR) filter 60 in the control signal generator 26. The IIR filter 60 can perform the IIR filtering on the control data 134 to minimize the tracking error more effectively.

The IIR filter 60 is a digital filter which has its impulse response characteristic infinitely continuing. The IIR filter 60 can provide a steep cut-off characteristic. In this embodiment, the IIR filter 60 receives the control data 134 from the register 46. In response to the update-timing signal 132 from the timing generator 48, the IIR filter 60 performs the IIR filtering on the control data 134 in an IIR filtering section 62. The IIR filter 60 then outputs the filter output data 202 to the comparator 50. The IIR filtering can prevent the gain variation which would otherwise be caused by the ON/OFF switching of the low-noise amplifier 28.

Well, in this alternative embodiment, let the control data 134 processed by the IIR processing section 62 be B_Data (x) at the present instant or cycle x and the filter output data 202 be B_Data_Out (x). The IIR filter 60 uses the filter output data, B_Data_out (x−1), at the immediately preceding cycle (x−1) to calculate out data, B_Data_Out (x), from the control data, B_Data (x), at the present cycle according to the following expression (1), for example.

$$B\_Data\_Out\ (x) = B\_Data\_Out\ (x-1) - (B\_Data\_Out\ (x-1) - B\_Data\ (x)) >> 1 \quad (1)$$

When the update-timing signal 132 indicates the first cycle, for example, the IIR filtering section 62 in the IIR filter 60 directly outputs the control data 134 as the filter output data 202. When the update-timing signal 132 indicates the second cycle or the following thereto, the IIR filtering section 62 outputs the calculation result from the expression (1) as the filter output data 202. This operation sets, at the beginning of the packet signal, a certain level of the AGC control value, and performs the AGC control with higher accuracy. This can provide a high-speed AGC convergence operation in the packet transmission, and can prevent the tracking error at the control signal changing point of the low-noise amplifier 28.

The IIR filter 60 may advantageously compare the filter output data 202 thus determined with a predetermined comparison value such as zero or a predetermined maximum value, Max. When the data 202 is less than the zero, the IIR filter 60 may set the filter output data 202 to zero and output it. When the data 202 exceeds the maximum value, Max, the IIR filter 60 may set the data 202 to the maximum value, Max, and output it.

The comparator 50 compares the filter output data 202 provided from the IIR filter with the predetermined comparison value 136. The comparator 50 then generates the LNA control signal 138 and provides it to the low-noise amplifier 28 and selector 52. In this embodiment, the comparator 50, selector 52, and operator 54 may function and operate in the same way as in the above-described embodiment.

Figure 3:
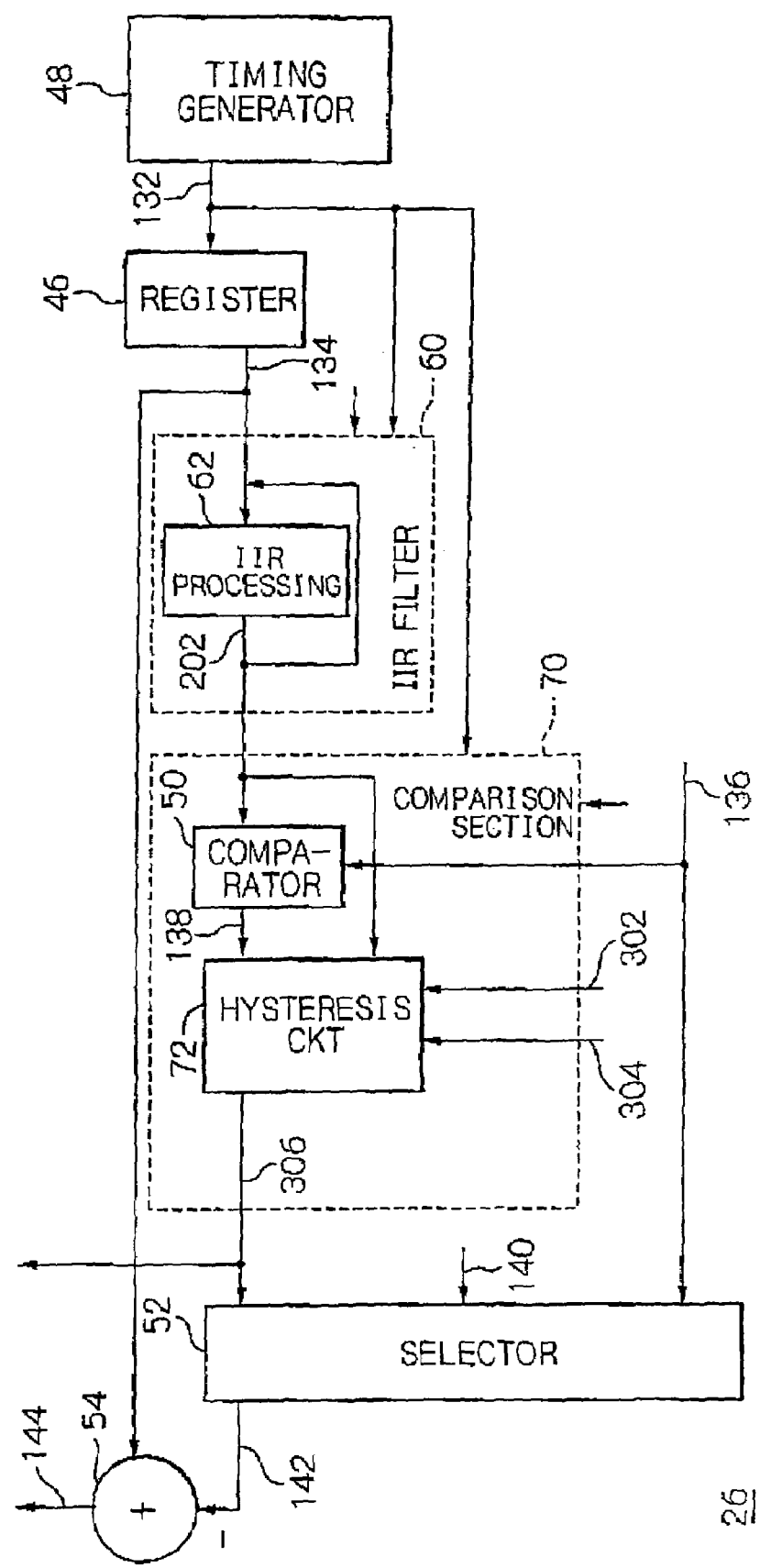
FIG. 3 is a schematic block diagram showing a control signal generator in an alternative embodiment of the AGC circuit according to the present invention.

The IIR filter 60 may halt the IIR filtering as shown in FIG. 2 during a predetermined filtering stop period set by the upper layer from when the timing generator 48 starts to generate the update-timing signal. During the filtering stop period, the IIR filter 60 may directly output, as the filter output data 202, the control data 134 received into the IIR filter 60, FIG. 3 shows yet another embodiment in which the AGC circuit 11 includes a hysteresis circuit 72 in the control signal generator 26. According to the filter output data 202 from the IIR filter 60, the LNA control signal 138 from the comparator 50, the upper-limit threshold value 302, and the lower-limit threshold value 304, the hysteresis circuit 72 performs a hysteresis process which decides whether to change the LNA control signal 138, thereby reducing the tracking error.

The control signal generator 26 in this alternative embodiment includes the comparator 50 and hysteresis circuit 72 which together form a comparison section 70. The comparison section 70 may operate in response to the update-timing signal 132 from the timing generator 48.

The comparator 50 compares the filter output data 202 with the predetermined comparison value 136, as in the above-described embodiment. The comparator 50 turns ON the LNA control signal 138 when the filter output data 202 is equal to or more than the comparison value 136. The comparator 50 turns the LNA control signal 138 OFF, or to its low level, when the filter output data 202 is less than the comparison value 136. In this embodiment, the comparator 50 outputs the LNA control signal 138 to, particularly, the hysteresis circuit 72.

The hysteresis circuit 72 decides the LNA control signal 138 from the comparator 50. The hysteresis circuit 72 also compares the filter output data 202 with an upper-limit or lower-limit threshold value 302 or 304. When the LNA control signal 138 is in its OFF state and the filter output data 202 exceeds the upper-limit threshold value 302, the hysteresis circuit 72 turns ON the LNA control signal and outputs it in the form of LNA control signal 306. When the LNA control signal 138 is in its ON state and the filter output data 202 is less then the lower-limit threshold value 304, the hysteresis circuit 72 turns OFF the LNA control signal and outputs it in the form of LNA control signal 306. Otherwise, the hysteresis circuit 72 may directly output the LNA control signal 138 as the LNA control signal 306.

Until a predetermined number of cycles have passed from when the hysteresis circuit 72 recognized the packet transmission signal, the circuit 72 may not perform the hysteresis process but may directly output the LNA control signal 138 as the LNA control signal 306. The hysteresis circuit 72 may perform the hysteresis process after the predetermined number of cycles have passed. The hysteresis circuit 72 performs the hysteresis process in response to the update-timing signal 132 from the timing generator 48. The hysteresis circuit 72 may not perform the hysteresis process, for example, until the timing signal 132 has been input for a predetermined number of cycles. The hysteresis circuit 72 may then perform the hysteresis process when the timing signal 132 has been input for more than the predetermined number of cycles. The predetermined number may be an integer equal to or more than one. The hysteresis process may operate from the first cycle.

The comparison section 70 in this embodiment uses such a hysteresis process to generate the LNA control signal 306 which is provided to the low-noise amplifier 28 and selector 52 which process the signal 306 as described above.

The hysteresis circuit 72 may stop the hysteresis process as shown in FIG. 3 during a predetermined hysteresis process stop period set by the upper layer from when the timing generator 48 starts to generate the update-timing signal. During the hysteresis process stop period, the hysteresis circuit 72 may directly output as the LNA control signal 306 the LNA control signal 138 received into the hysteresis circuit 72.

Figure 4:
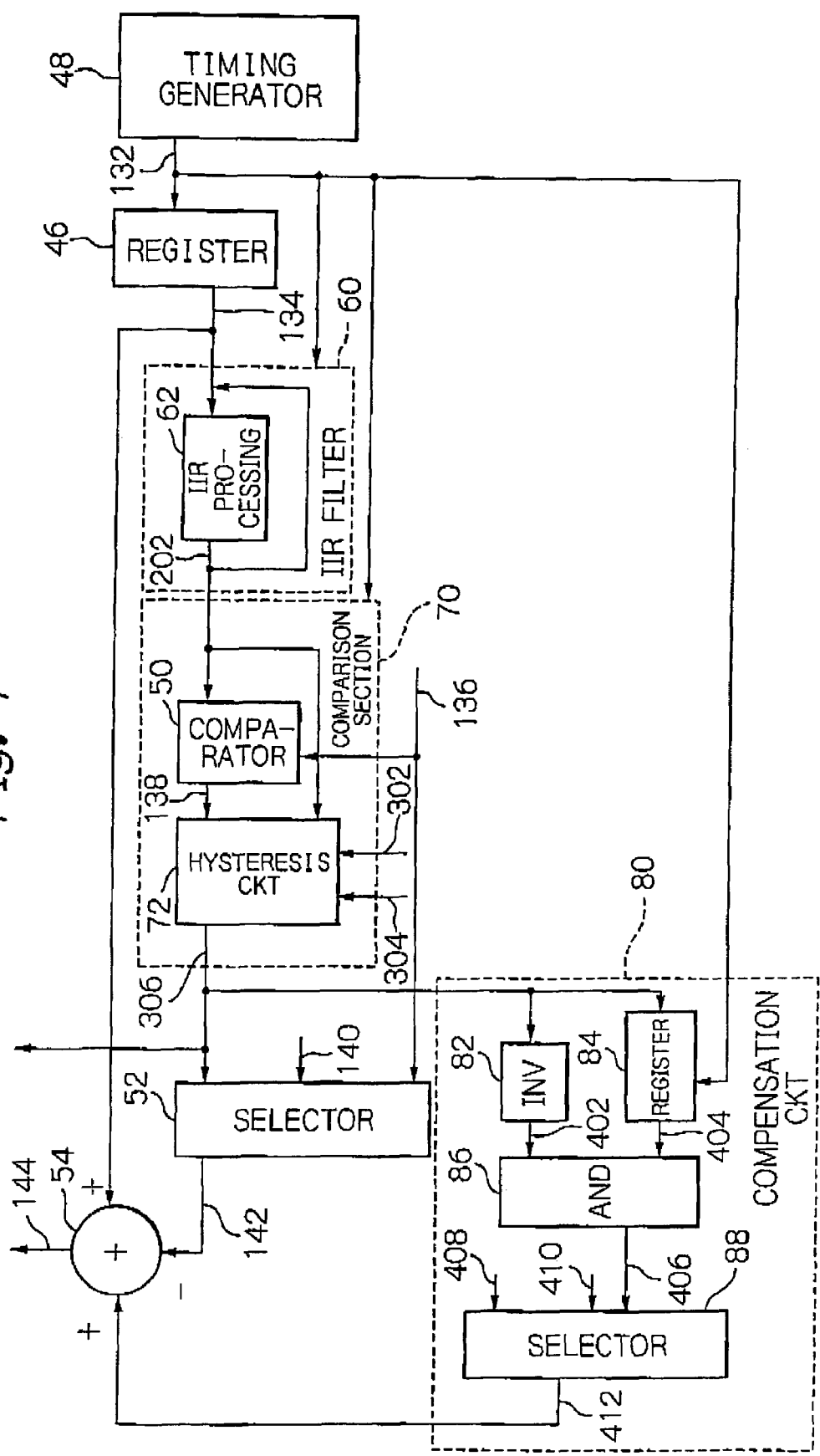
FIG. 4 is a schematic block diagram showing a control signal generator in an alternative embodiment of the AGC circuit according to the present invention.

Now, FIG. 4 shows a still yet alternative embodiment in which the AGC circuit 11 includes a compensation circuit 80 in the control signal generator 26. According to the change in the LNA control signal 306, the compensation circuit 80 generates the compensation data 412. The compensation data 412 can be used to generate the VGA control signal 144, thereby reducing the AGC convergence time. For example, when the LNA control signal 402 is in its OFF state and the immediately-preceding LNA control signal 404 is in its ON state, the compensation circuit 80 outputs the predetermined compensation data 408 as the compensation data 412. Otherwise, the compensation circuit 80 outputs the zero data 410 of value zero as the compensation data 412.

Figure 5:
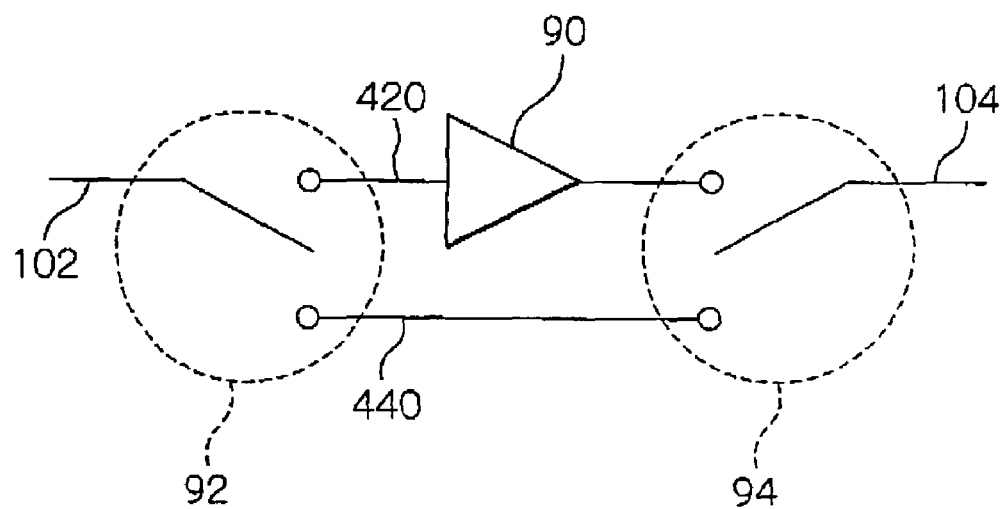
FIG. 5 is a schematic block diagram exemplifying the configuration of a low-noise amplifier in the receiver in the embodiment shown in FIG. 1.

As shown in FIG. 5, the low-noise amplifier 28 in the RF circuit 14 switches the switches 92 and 94, in response to the LNA control signal 306, to select a signal path 420 with a gain applied by an LNA circuit 90 or a signal path 422 without applying a gain. When the signal path 422 is selected, i.e., the LNA control signal 306 is in its OFF state, signal loss is encountered in the wiring. This means an increased AGC convergence time in the AGC tracking when the LNA control signal 306 is changed. For example, the low-noise amplifier 28 has its gain characteristics such that a gain equal to 20 dB is attained when the LNA control signal 306 is in its ON state, and a gain of −3 dB is attained when the LNA control signal 306 is in its OFF state.

In this instant embodiment, the compensation circuit 80 compensates the wiring loss by performing the compensation only when the LNA control signal 306 turns OFF from its ON state. Note that, if the compensation circuit 80 performed the compensation other than when the signal 306 changes from ON to OFF, the compensation data would cause the variable-gain amplifier 30 to eternally fail to set the set value to zero.

For example, in this alternative embodiment, the compensation circuit 80 inputs the LNA control signal 306 from the comparison section 70 to an inverter (INV) 82 and a register 84. The inverter 82 inverts the LNA control signal 306 and outputs an inverted signal 402 to an AND gate 86. The register 84 stores the LNA control signal 306. The register 84 is in response to the update-timing signal 132 from the timing generator 48 to output an immediately-preceding LNA control signal 404 to the AND gate 86. The AND gate 86 determines whether the inverted signal 402 is in its OFF state and the immediately-preceding LNA control signal 404 is in its ON state. The AND gate 86 then outputs to a selector 88 a flag 406 indicating True or False. If the flag 406 indicates True, the selector 88 then transfers predetermined compensation data 408 as compensation data 412. If the flat 406 is False, the selector 88 outputs zero data 410 as the compensation data 412.

In the control signal generator 26 in this embodiment, the compensation circuit 80 outputs the compensation data 412 to the operator 54. The operator 54 uses the compensation data 408, the control data 134 from the register 46, and the selected data 142 from the selector 52 to calculate out the VGA control signal 144 according to the relationship; (control data 134)−(selected data 142)+(compensation data 408). The operator 54 then provides the VGA control signal 144 to the variable-gain amplifier 30.

In this way, in the control signal generator 26 in this embodiment, the variable-gain amplifier 30 uses, when the low-noise amplifier 28 is in its ON state, the one predetermined comparison value 136 as an increment of the gain value. When the low-noise amplifier 28 is in its OFF state, the variable-gain amplifier 30 employs the other predetermined compensation data 408 as an increment of the gain value.

When the low-noise amplifier 28 is in its OFF state, the automatic gain control operation will eventually converge without the compensation control. If more quick convergence is required, then the compensation circuit 80 in this embodiment is used even when the low-noise amplifier 28 is in its OFF state, the compensation is controlled, so that the automatic gain control accomplishes a rapid convergence, thus reducing the AGC convergence time.

Figure 6:
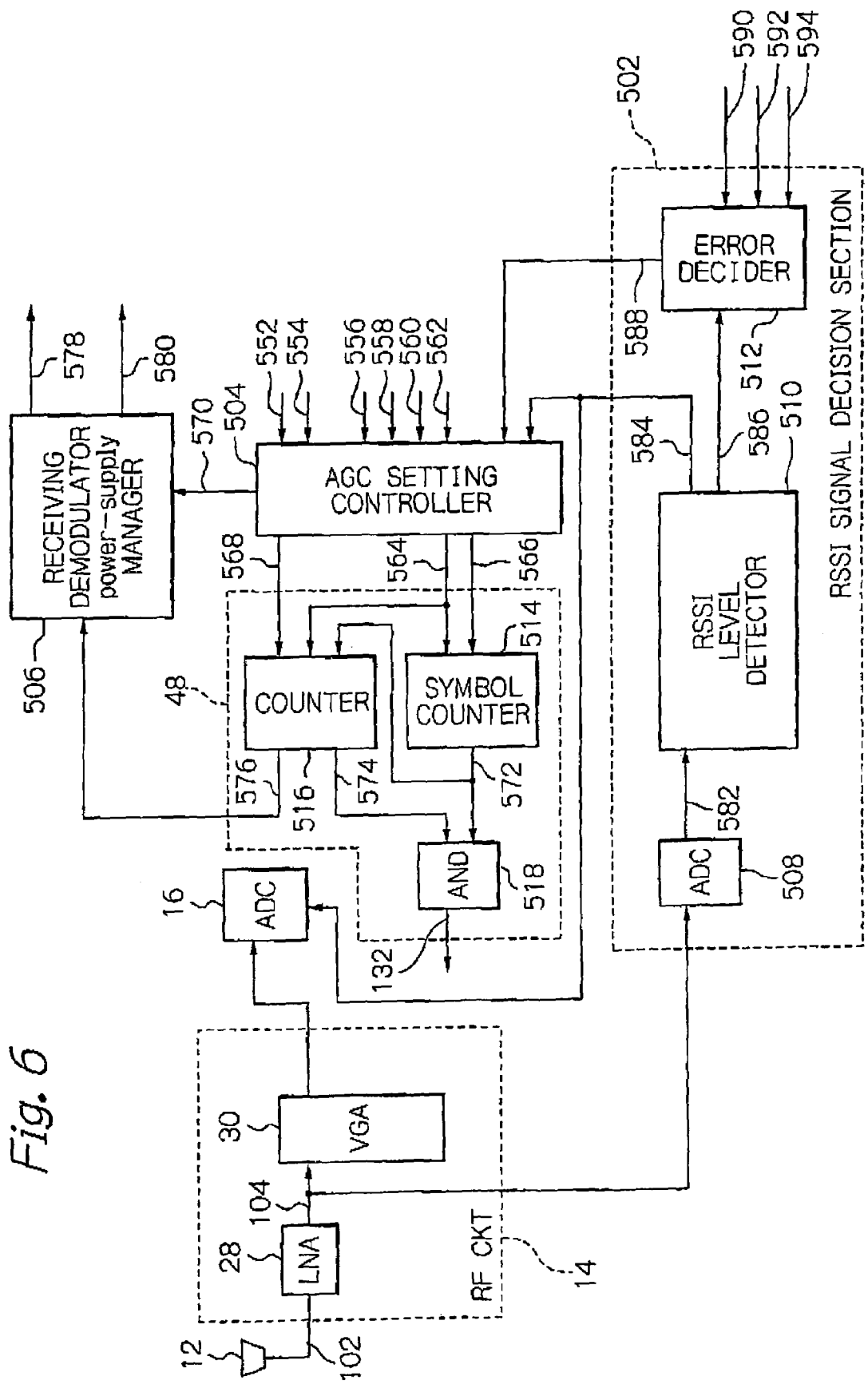
FIG. 6 is a schematic block diagram showing an AGC setting controller in another alternative embodiment of the AGC circuit according to the present invention.

FIG. 6 shows a still yet alternative embodiment in which the AGC circuit 11 includes a receiving signal strength indicator (RSSI) signal decision section 502. The RSSI signal decision section 502 is adapted to determine the level of the RSSI signal and controls an AGC setting controller 504 according to the result from the determination. The AGC setting controller 504 controls the operation of the timing generator 48 which establishes the timing of the automatic gain control. The AGC setting controller 504 also controls the operation of the ADC section 16. The RSSI signal decision section 502 includes an RSSI level detector 510. When the RSSI level detector 510 fails to detect a desired signal, it is possible to stop the AGC tracking so as to reduce the power consumption in the circuits otherwise involved in the automatic gain control. It is also possible to cease the variable-gain amplifier 30 in the RF circuit 14 and other operations in circuits such as a demodulator, not shown, thereby reducing the power consumption.

The AGC circuit 11 has its AGC tracking control function by which the AGC setting controller 504 controls the timing generator 48 and the receiving demodulator power-supply manager 506 which generate a fixed-cycle signal and a demodulator power supply control signal, respectively. The AGC setting controller 504 controls the timing generator 48 and receiving demodulator power-supply manager 506, according to the demodulation mode which is input from the upper layer of the system as well as the synchronous information, asynchronous information and AGC loop stop information which are input from the demodulator. The AGC setting controller 504 in this embodiment provides the timing generator 48 with the AGC settings corresponding to any one of a plurality of the demodulators, such that the timing generator 48 generates the update-timing signal 132 for that demodulator.

The receiver 10 can include a plurality of demodulators corresponding to respective modulation schemes such as the Orthogonal Frequency Division Multiplexing (OFDM) and Direct Sequence Spread Spectrum (DSSS) systems. In those demodulators, it is set in advance at the initial stage by the upper layer whether or not the demodulation mode is enabled. Assume, for example, that the receiver 10 has the first and second demodulators corresponding to the DSSS and OFDM systems, respectively, and employ IEEE 802.11b and 802.11a standards with the specifications of "dsss only" and "ofdm only", respectively. If the user requires the use of IEEE 802.11b standard, the demodulation mode 552 in the first demodulator is set active and the demodulation mode 554 in the second demodulator is set inactive at the startup of the receiver 10. When the user sets again to IEEE 802.11a standard, the first demodulation mode 552 is set again inactive and the second demodulation mode 554 is set again active. The AGC setting controller 504 is adapted to receive the demodulation modes 552 and 554 for only two demodulators. The AGC setting controller 504 may, however, actually be adapted to receive more than two demodulation modes respectively corresponding to more than two demodulators.

The AGC setting controller 504 receives the first demodulation mode synchronous information 556 indicating whether the first demodulator has established synchronization with the received signal. The AGC setting controller 504 also receives the second demodulation mode synchronous information 558 indicating whether the second demodulator has established synchronization with the received signal the AGC setting controller 504 also receives the first demodulation mode asynchronous information 560 indicating that the first demodulator operates asynchronously. The AGC setting controller 504 may be adapted to perform the AGC setting and synchronization detection for the second demodulator at the timing when the first demodulation mode asynchronous information 560 turns ON, i.e., enabled.

The AGC setting controller 504 is responsive to the modulation scheme, i.e., to the demodulation modes 552 and 554, synchronous information 556 and 558 and asynchronous information 560, to decide whether to perform the AGC setting corresponding to the first demodulator or to the second demodulator, and decide whether to perform the infinite or finite automatic gain control in the timing generator 48. The AGC setting controller 504 in this embodiment may have, for example, the first finite AGC setting mode corresponding to the first demodulator, the second finite AGC setting mode corresponding to the demodulator, and the infinite AGC setting mode common to the first and second demodulators. The AGC setting controller 504 may be adapted to switch and set the respective AGC setting modes enabled or disabled, or to select and set either one of the AGC setting modes.

The AGC setting controller 504 responds to the demodulation modes 552 and 554, the synchronous information 556 and 558 and the asynchronous information 560, to set the above AGC setting modes as shown in FIG. 7, for example. In FIG. 7, the capital letters "X" denote that either of ON and OFF is acceptable. In the boxes of the table regarding the demodulation mode, the numerals "0" denote that the first and second demodulation modes 552 and 554 are both in the ON state thereof, i.e., active, the numerals "1" denote that only the first demodulation mode 552 is in its ON state, the numerals "2" denote only that the second demodulation mode 554 is in its ON state, and the small letters "x" denote that any one of "0", "1" and "2" is acceptable. For example, the first finite AGC setting mode is set to its ON state when both the first and second demodulation modes 552 and 554 are in the ON state thereof, and the first demodulation mode asynchronous information 560 is in its OFF state. Alternatively, the second finite AGC setting mode is set to its ON state when both the first and second demodulation modes 552 and 554 are in the ON state thereof as well as the first demodulation mode a synchronous information 560 is in its ON state, and the first demodulation mode synchronous information 556 is in its OFF state. The first finite AGC setting mode is set to its ON state when only the first demodulation mode 552 is in its ON state, regardless of the synchronous information and synchronous information. The second finite AGC setting mode is set to its ON state when only the second demodulation mode 554 is in its ON state, regardless of the synchronous information and synchronous information.

According to the AGC setting mode, the AGC setting controller 504 in this embodiment changes a symbol time output 566 and a symbol number output 568, and sets them on the timing generator 48. When the first finite AGC setting mode is in its ON or active state, for example, the AGC setting controller 504 sets the first symbol time and first symbol number which correspond to the first demodulator on the symbol time output 566 and symbol number output 568, respectively. When the second finite AGC setting mode is in its ON state, the AGC setting controller 504 sets the second symbol time and second symbol number which correspond to the second demodulator on the symbol time output 566 and symbol number output 568, respectively. When the infinite AGC setting mode is in its ON state, the AGC setting controller 504 outputs the symbol time output 566 which is equal to either the first symbol time or the average of the first and second symbol times to output the symbol number output 568 indicating the infinite value. This allows the continuous automatic gain control when the infinite AGC setting mode is in its ON state.

The AGC setting controller 504 outputs to the timing generator 48 an encode signal 564 which is usually in its ON sate. The AGC setting controller 504 sets the encode signal 564 to its OFF state when changing the symbol time output 566 and symbol number output 568 or stopping the AGC tracking control.

The AGC setting controller 504 in this embodiment also responds to the demodulation mode 552 and 554, the synchronous information 556 and 558 and the asynchronous information 560 to generate control information 570 including the first and second power supply settings for the first and second demodulators, respectively, as shown in FIG. 8, for example. The AGC setting controller 504 then outputs the control information 570 to the receiving demodulator power-supply manager 506. In FIG. 8, the capital letters "X" denote that both ON and OFF are acceptable. In the boxes concerning the demodulation mode, the numerals "0" denote that the first and second demodulation modes 552 and 554 are both in the ON state thereof, the numerals "1" denote that only the first demodulation mode 552 is in its ON state, the numerals "2" denote that only the second demodulation mode 554 is in its ON state, and the small letters "x denote that any one of "0", "1" and "2" is acceptable. For example, the first power supply setting is set to its ON state when both the first and second demodulation modes 552 and 554 are in the ON state thereof, and the first demodulation mode asynchronous information 560 is in its OFF state. Alternatively, the second power supply setting is set to its ON state when both the first and second demodulation modes 552 and 554 are in the ON state thereof, and the first demodulation mode asynchronous information 560 is in its ON state. The first power supply setting is set to its ON state when only the first demodulation mode 552 is in its ON state, regardless of the synchronous information and synchronous information. The second power supply setting is set to its ON state when only the second demodulation mode 554 is in its ON state, regardless of the synchronous information and synchronous information.

Now returning to FIG. 6, the timing generator 48 in this embodiment includes a symbol counter 514, a counter 516, and an AND gate 518 which are interconnected as illustrated. The timing generator 48 is responsive to the AGC setting mode in the AGC setting controller 504, i.e., according to the encode signal 564, symbol time output 566, and symbol number output 568 which are provided from the AGC setting controller 504 to generate and output the update-timing signal 132 as a fixed-cycle signal.

The timing generator 48 may perform the integration at a time interval corresponding to the symbol time output 566 for the number of times indicated by the symbol number output 568. The symbol time output 566 indicates a one-symbol period of time which depends upon the modulation scheme. In this embodiment, in the type of AGC control which measures the energy of the symbol signal, the measurement made in a time segment equal to the symbol time increases the measurement accuracy, and the fixed-cycle signal generation made according to the setting mode can optimize the energy calculation process. The symbol number output 568 indicates the number of symbols of the AGC controls in the timing generator 48. In this embodiment, the more number of adjustments provide the stabler AGC control value with the longer process time. Thus, the symbol number output 568 is set according to the setting mode to thereby adjust the processing time period.

The symbol counter 514 receives the encode signal 564 and symbol time output 566, and outputs to the counter 516 and AND gate 518 a pulse signal 572 indicating the timing cycle. When the symbol counter 514 receives the symbol time output 566 indicating a time interval, Int, for example, the counter 514 generates and outputs the pulse signal 572 having its period corresponding to Int multiple of the cycle of a reference operational clock signal, not shown. The reference operational clock signal may be output for every Int cycles to provide the pulse signal 572. The symbol counter 514 generates the pulse signal 572 only when the encode signal 564 is in its ON or enabled state, and does not generate the pulse signal 572 when the encode signal 564 is in its OFF or disabled state. The symbol counter 514 thus outputs the pulse signal 572 consecutively when the encode signal 564 is not in its OFF state.

The counter 516 receives the encode signal 564, symbol number output 568, and pulse signal 572. The counter 516 counts the number of pulses in the pulse signal 572. The counter 516 turns ON the encode signal 574 for a period of time corresponding to the number of symbols indicated by the symbol number output 568, and otherwise keeps the encode signal 574 OFF or inactive. The counter 516 then outputs the encode signal 574 to the AND gate 518. The counter 516 performs the decision only when the encode signal 564 is in its ON state, and may not perform it when the encode signal 564 is in its OFF state. When the encode signal 574 is output, the counter 516 outputs the AGC loop operation information 576 representative of the ON or OFF state of the encode signal 564 to the receiving demodulator power-supply manager 506.

The AND gate 518 performs the AND operation between the encode signal 574 from the counter 516 and the pulse signal 572 from the symbol counter 514. The AND gate 518 then outputs the AND operation result in the form of update-timing signal 132.

The operation of the timing generator 48 thus configured will be described as follows with reference to the timing chart in FIG. 9, for example. In the timing generator 48 in this alternative embodiment, the symbol counter 514 first receives a reference operational clock signal, clk. The reference operational clock signal, clk, may be common in the receiver 10. Other signals which are input to the timing generator 48 may also be synchronized with the reference operational clock signal, clk. The AGC setting controller 504 has a symbol number of 0×2 and a symbol time of 0×3 which are settable values.

The AGC setting controller 504 then receives the RSSI decision signal 584 which is turned ON at time t1. In response to the RSSI decision signal 584, the timing generator 48 receives the symbol time output 566 and symbol number output 568 at time t2, and receives the encode signal 564 which rises at time t3.

The symbol counter 514 generates the pulse signal 572 which rises, or goes positive, at time t4 after the reference operational clock signal, clk, has passed for a time 0×3 indicated by the symbol time output 566. The symbol counter 514 outputs the pulse signal 572 to the counter 516.

The counter 516 counts the pulse signal 572. Until time t5 after the signal, clk, has passed for a time 0×2 indicated by the symbol number output 568, the counter 516 outputs the pulse signal 572 as the encode signal 574 to the AND gate 518. The AND gate 518 then outputs the update-timing signal 132. When the encode signal 574 output is stopped at time t5, the AGC loop operation information 576 is turned ON and output.

In this embodiment, the receiving demodulator power-supply manager 506 is operative in response to control information 570 from the AGC setting controller 504 and AGC loop operation information 576 from the counter 516, and controls the ON and OFF states of the first demodulator power supply control signal 578 and second demodulator power supply control signal 580 to output the results. The receiving demodulator power-supply manager 506 may be adapted to determine the control information 570 in such a manner that when the first power supply setting is in its ON state the manager 506 turns ON the first demodulator power supply control signal 578 and output it whereas when the second power supply setting is in its ON state the manager 506 turns ON the second demodulator power supply control signal 580 and output the latter. Additionally, when the AGC loop operation information 576 is in its OFF state, the manager 506 turns OFF both the first and second demodulator power supply control signals 578 and 580, and outputs them, regardless of the control information 570.

In this alternative embodiment, the RSSI signal decision section 502 includes the ADC circuit 508 and RSSI level detector 510. The ADC circuit 508 analog-to-digital converts the RSSI signal 104 from the low-noise amplifier 28 and generates the digital RSSI signal 582. The RSSI level detector 510 compares the digital signal 582 with a predetermined expected value and outputs the RSSI decision signal 584. The RSSI level detector 510 power-operates, for example, the digital signal 582 and compares its power value with a predetermined expected value. If the power value is equal to or more than a predetermined expected value, the RSSI level detector 510 turns ON the RSSI decision signal 584, and otherwise turns OFF the RSSI decision signal 584.

The RSSI level detector 510 in this embodiment provides the RSSI decision signal 584 to the ADC section 16 and AGC setting controller 504. Only when the RSSI decision signal 584 is in its ON state, the AGC tracking process is operated. When the signal 584 is in its OFF state, the AGC tracking is stopped. When the RSSI decision signal 584 is in its ON state, the AGC setting controller 504 turns the encode signal 564 ON. When the signal 584 is in its OFF state, the controller 504 turns the encode signal 564 OFF. When the RSSI decision signal 584 is in its ON state, the ADC section 16 performs the A/D conversion and outputs the digital signal. When the signal 584 is in its OFF state, the ADC section 16 stops the A/D conversion and stops outputting the digital signal.

The AGC circuit 11 including the RSSI level detector 510 as described above operates as follows, for example. In the AGC setting controller 504, when the first and second demodulation modes 552 and 554 are both in the ON state therof, and when an energy expected as the RSSI signal detection is confirmed, i.e., when the RSSI decision signal 584 is in its ON state, the first finite AGC setting mode is turned ON, and the symbol time output 566 and symbol number output 568 are set corresponding to the first demodulator to generate a timing signal according to which the automatic gain control operates. When the automatic gain control in the first finite AGC setting mode stops, the first power supply setting is turned ON, waiting for a synchronization establishment signal from the first demodulator.

If the synchronization is not established in the first demodulator but the first demodulation mode asynchronous information 560 is turned ON, the first power supply setting is then turned OFF. At the same time, the second finite AGC setting mode is turned ON, and the symbol time output 566 and symbol number output 568 are set corresponding to the second demodulator to generate a timing signal according to which the automatic gain control operates. When the AGC control in the second finite AGC setting mode stops, the second power supply setting is turned ON, waiting for a synchronization establishment signal from the second demodulator.

The RSSI signal decision section 502 may include the error decider 512. The RSSI level detector 510 outputs to the error decider 512 an energy value 586 obtained by averaging of the digital RSSI signal 582. The error decider 512 may be adapted such that when the RSSI decision signal 584 is turned ON so that the timing generator 48 starts to generate the update-timing signal and when the error decider 512 receives the synchronous information from all demodulators, the error decider 512 turns ON the error information according to the setting from the upper layer and provides the latter to the AGC setting controller 504.

The error decider 512 in this embodiment decides the error of the energy value 586. If, for example, the energy value 586 is less than a predetermined threshold value, the error decider 512 turns ON the error information 588.

Otherwise, the error decider 512 turns OFF the error information 588 and outputs it to the AGC setting controller 504. The error decider 512 may be adapted such that if the upper layer has its packet error rate (PER) high, the error decider 512 forcibly turns ON the error information 588. Note that, when the synchronization signal is established, the error decision will be stopped.

In the RSSI signal decision section 502, therefore, if the RSSI level detector 510 can determine the received signal, the RSSI level detector 510 triggers the automatic gain control. If the RSSI level detector 510 cannot determine the received signal due to its environmental conditions, however, the error decider 512 then turns ON the error information 588 so that the demodulators, not shown, are always in the synchronization detection mode thereof.

Note that, when the error information 588 is in its ON state and the automatic gain control is effective infinitely and continuously, the beginning of the signal cannot be determined unlike the RSSI signal detection. In this embodiment, therefore, after a predetermined time has passed since the first demodulator turns ON the first demodulation mode synchronous information 556, the AGC loop stop signal 562 is preferably output to the AGC setting controller 504.

After receiving the error information 588 which is in its ON state, the AGC setting controller 504 goes into the infinite AGC setting mode. The AGC setting controller 504 then turns ON the encode signal 564 and outputs it to the timing generator 48. The timing generator 48 infinitely operates the AGC tracking process as long as the encode signal 564 is in its ON state. When the inputted AGC loop stop information 562 is turned ON, the AGC setting controller 504 turns OFF the encode signal 564 and outputs it to the timing generator 48, thereby stopping the infinite operation.

The AGC setting controller 504 can turn the encode signal 564 ON, or its high level, with the setting of the average of the symbol times in the first and second finite AGC setting modes as the symbol time output 566. When the demodulation mode synchronous information 556 or 558 is turned ON, the controller 504 can set the symbol time and symbol number in the demodulation mode corresponding to the information 556 or 558.

In the AGC setting controller 504, when the error information 588 is in its ON state and both the first and second demodulation modes 552 and 554 are in the ON state thereof, as shown in FIG. 7, for example, the infinite AGC setting mode is in its ON state. When the second demodulation mode synchronous information 558 is in its OFF state, the first finite AGC setting mode is in its ON state. Note that even when the first demodulation mode synchronous information 556 is in its ON state, no particular change is made to the setting. In FIG. 7, with respect to the boxes where the infinite AGC setting mode is expressed by "#", when the infinite AGC setting mode is "1", the infinite state may be released according to the AGC loop stop information, and when the infinite AGC setting mode is "0", the AGC loop stop information may be neglected.

The AGC setting controller 504 can also determine the power supply setting in each demodulator according to the error information 588, as shown in FIG. 8, for example. When the error information 588 is in its ON state, and both the first and second demodulation modes 552 and 554 are in the ON state thereof, if both first and second demodulation mode synchronous information 556 and 558 are in the OFF state thereof, then both the first and second power supply settings in the control information 570 are turned ON. Alternatively, when the error information 588 is in its ON state, and both the first and second demodulation modes 552 and 554 are in the ON state thereof, if only the first demodulation mode synchronous information 556 is in its ON state, then only the first demodulator power supply setting is turned ON.

The AGC setting controller 504 in this embodiment may stop, when the synchronization is established in the first demodulator, the automatic gain control operation. When the RSSI decision signal 584 from the RSSI level detector 510 is in its OFF state, the automatic gain control function is completely stopped. That may permit the RSSI decision signal 584 to be turned OFF when the packet signal is finished or any error occurs during the process. When the error decider 512 generates the error information 588 which is in its ON state, the decider 512 may output the error information 588 to the RSSI level detector 510 to cause the latter to turn ON the RSSI decision signal 584.

The AGC circuit 11 in this embodiment may have the function of turning OFF the demodulator power supply when the error information 588 is in its ON state and the AGC control values, i.e., the gain values of the low-noise amplifier 28 and variable-gain amplifier 30 keep constant. The AGC circuit 11 may turn ON the demodulator power supply when the AGC control value increases excessively relative to the constant value.

If the error information 588 is in its ON state with the AGC control value falling in a predetermined range set by the upper layer, then the AGC setting controller 504 can keep the power supply of the demodulator OFF until the AGC control value is changed to an excessive level.

As described above, the AGC setting controller 504 in this embodiment can perform the automatic gain control for the amplitude level according to the demodulation mode, and can detect the synchronization in a time sequence for different demodulation modes. The circuits in the receiver 10 have the current consumption effect and amplitude level adaptive to each demodulation mode, thereby making it possible to detect the synchronization more effectively.

Figure 10:
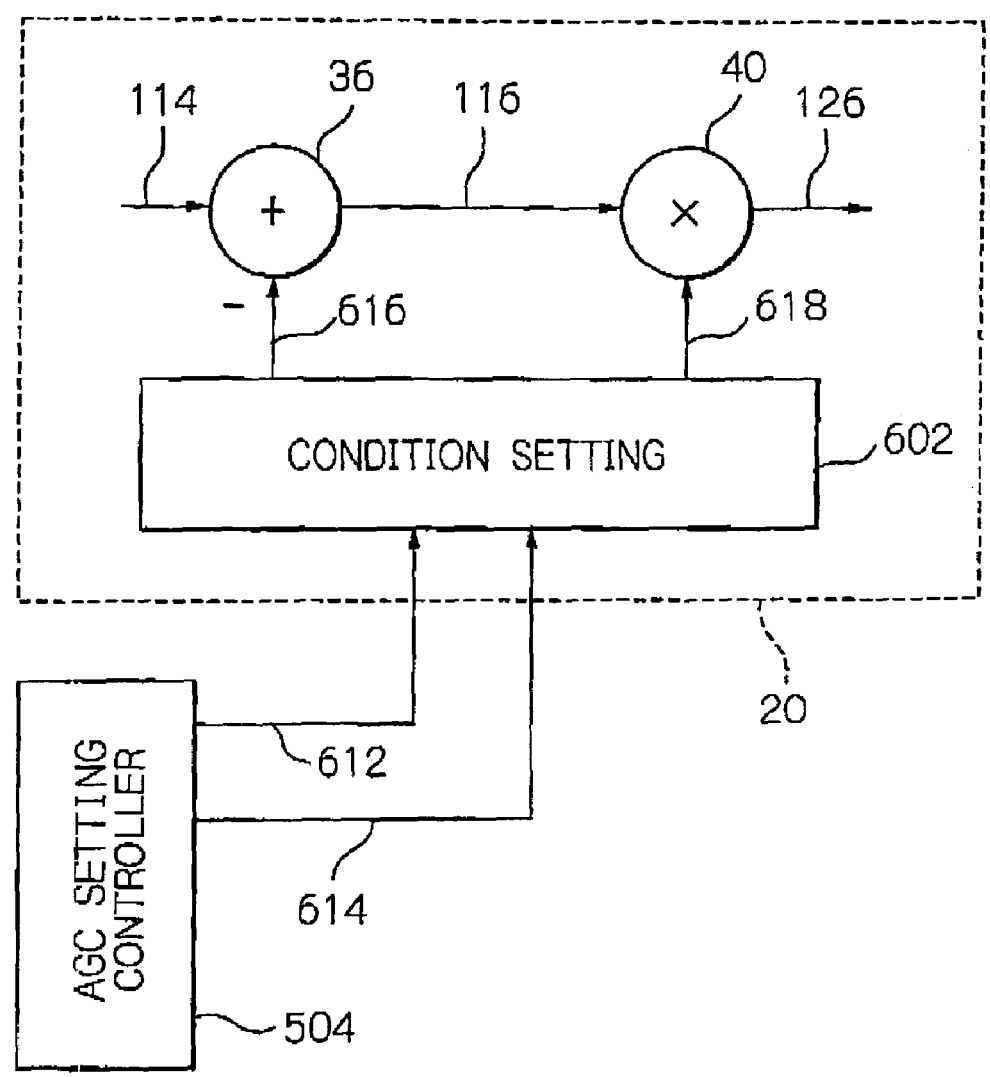
FIG. 10 is a schematic block diagram showing a scaling section in a further alternative embodiment of the AGC circuit according to the present invention.
Figure 11:
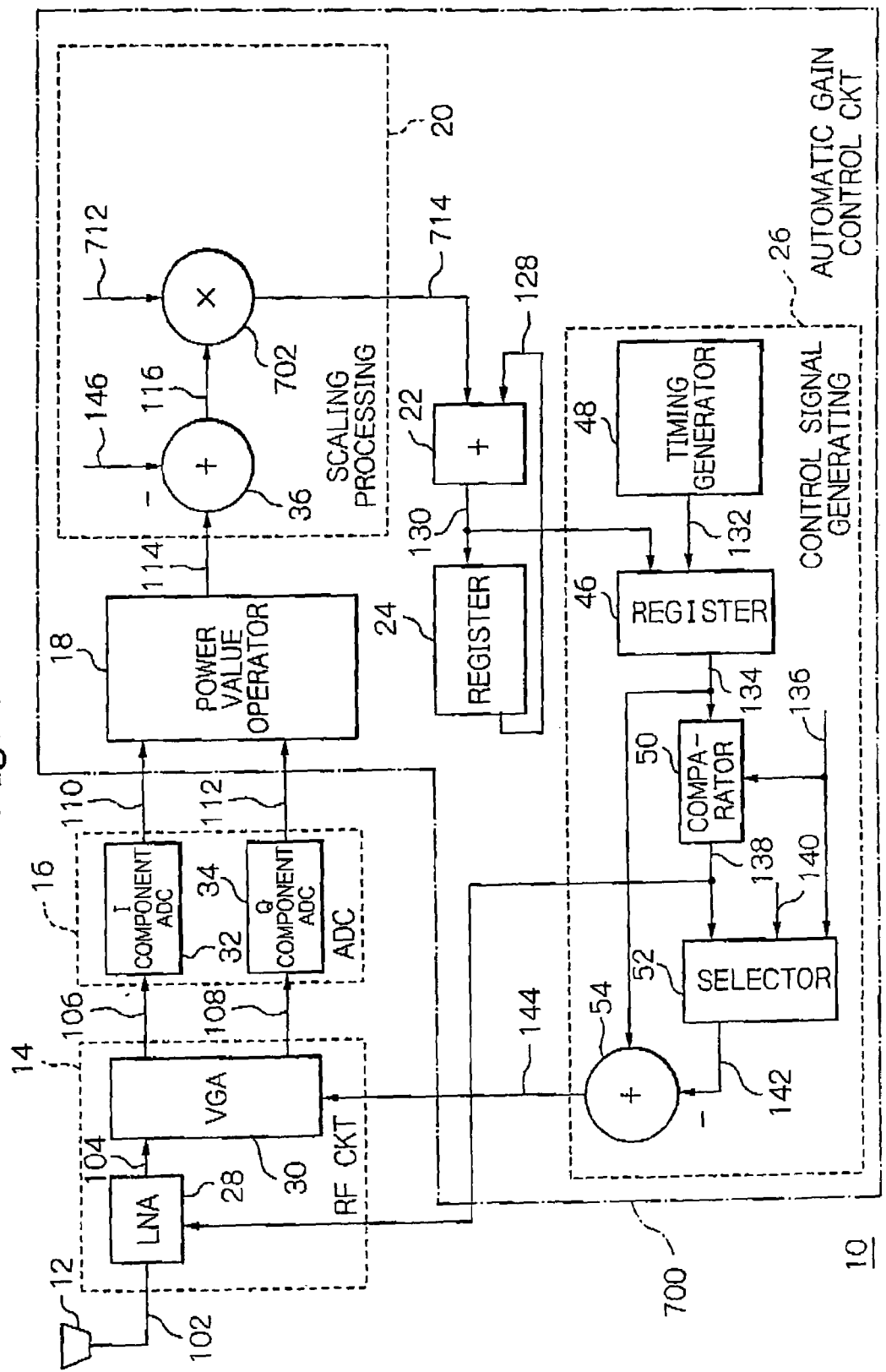
FIG. 11 is a schematic block diagram showing an example of a conventional AGC circuit applied to the receiver.

FIG. 10 shows a further alternative embodiment in which the AGC circuit 11 includes a condition setting section 602 in the scaling section 20. According to the setting by the AGC setting controller 504, the condition setting section 602 can change the target value 616 inputted to the operator 36, and the scaling coefficient 618 inputted to the multiplying section 40. This can reduce the tracking error.

The condition setting section 602 in this embodiment has the target value 616 and scaling coefficient 618 according to the tracking characteristics for the modulation schemes. According to the demodulation mode setting 612 inputted from the AGC setting controller 504, the condition setting section 602 determines and outputs the target value 616 and scaling coefficient 618. The condition setting section 602 may also serve as determining the error information 614 inputted from the AGC setting controller 504 to decide the target value 616 and scaling coefficient 618.

The condition setting section 602 may determine the target value 616 according to a bit width during the A/D conversion in the ADC section 16, for example. The AGC control requires the signal peak not to exceed the maximum amplitude value during the A/D conversion, and sets the average energy such that the peak value does not exceed the maximum amplitude value. Because the average energy and peak value are dependent upon different modulation schemes, this further alternative embodiment sets the target value 616 to the amplitude level according to the modulation scheme. The condition setting section 602 sets the target value 616 according to the demodulation mode setting 612 from the AGC setting controller 504. In this way, the demodulation mode setting 612 and error information 614 can be changed by the AGC setting controller 504, thereby providing more accurate tracking characteristics.

The demodulation mode setting 612 which is provided by the AGC setting controller 504 may be set according to the demodulation mode indicated as the first and second demodulation modes 552 and 554 in the AGC setting controller 504 included in the above-described embodiment. The demodulation mode setting 612 may also be set according to the AGC setting mode indicated by the first and second finite AGC setting modes, and infinite AGC setting mode. On the other hand, the error information 614 which is provided by the AGC setting controller 504 may be set according to the error information 588 in the AGC setting controller 504 in the above-described embodiment.

Figure 13:
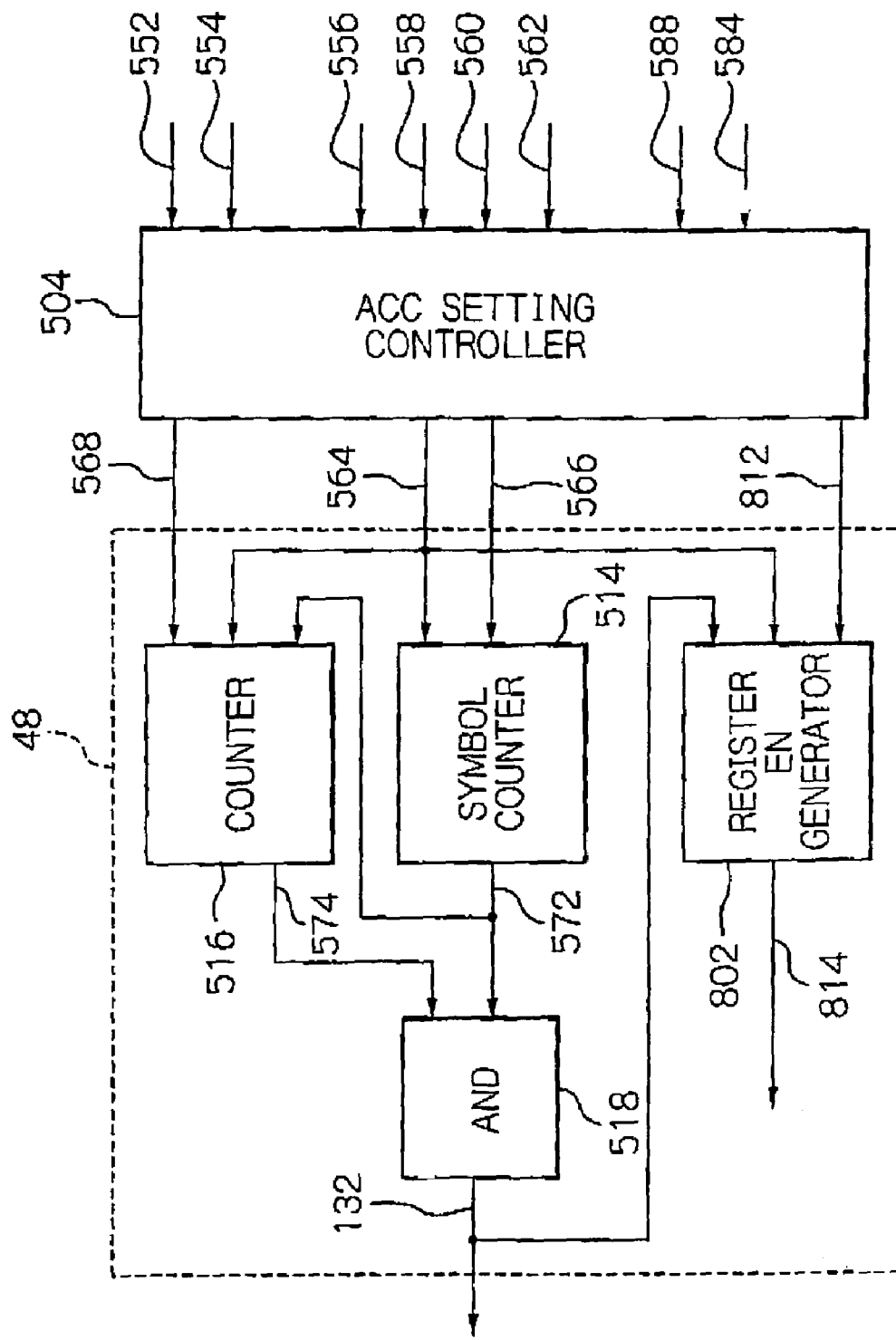
FIG. 13 is a schematic block diagram showing a stop signal generator in a still further alternative embodiment of the AGC circuit according to the present invention.

The timing generator 48 in this embodiment may include, as shown in FIG. 13, a stop signal generator 802 which outputs an addition-stop signal 814 to the register 24. The stop signal generator 802 may be adapted to respond to the update-timing signal 132 from the AND gate 518 and the encode signal 564 and stop-time output 812 from the AGC setting controller 504 to output the addition-stop signal 814 which causes the adder 22 to stop the addition.

In this further alternative embodiment, the register 24 may be adapted to stop, in response to the addition-stop signal 814, storing the control signal 130 as the previous data so as to substantially stop the addition and directly output the scaling result 126 in the form of the control signal 130.

Figure 14:
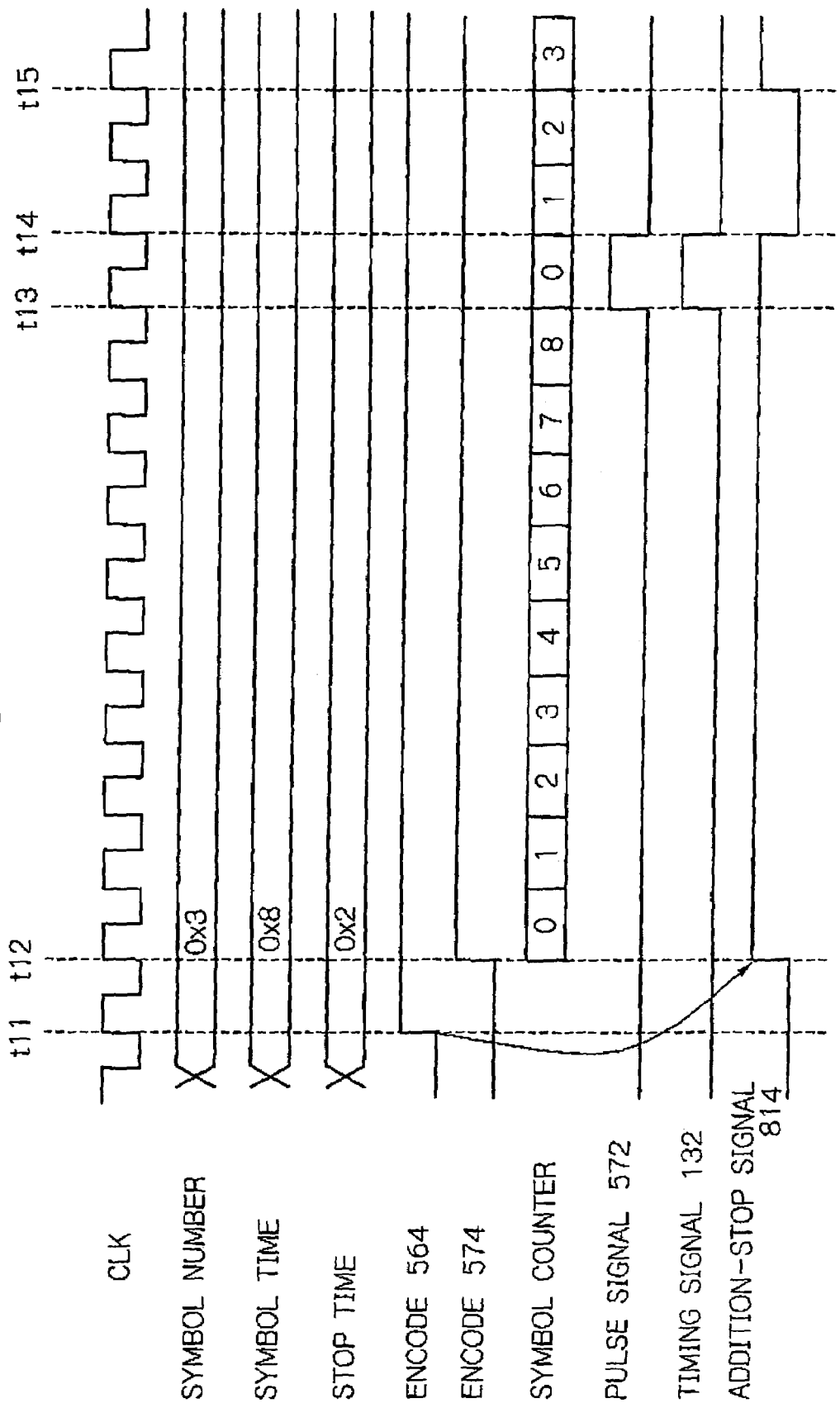
FIG. 14 is a timing chart useful for understanding the operation of the AGC circuit in the embodiment shown in FIG. 13.

The operation in the stop signal generator 802 will n be described as follows with reference to the timing chart in FIG. 14, for example.

In response to the positive-going edge of the encode signal 564 at time t11, the stop signal generator 802 turns ON the addition-stop signal 814 at time t12 and outputs it. The stop signal generator 802 then receives the update-timing signal 132 which first oscillates at time t13. In response to the update-timing signal 132, the stop signal generator 802 turns OFF the addition-stop signal 814 at time t14 and outputs it. Because of the stop-time output being 0×2, the stop signal generator 802 turns ON again the addition-stop signal 814 at time t15 after two clocks have passed.

In this way, the stop signal generator 802 may repeat turning OFF the addition-stop signal 814 in response to the oscillation of the update-timing signal 132 and turning ON again the signal 814 after the stop time period has passed.

The entire disclosure of Japanese patent application No. 2004-294628 filed on Oct. 7, 2004, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. An automatic gain control circuit applicable to a receiver including:
    an adjustment circuit including a low-noise amplifier and a variable-gain amplifier for adjusting amplification of a received signal in response to a low-noise amplification control signal and a variable-gain amplification control signal which are respectively input to said low-noise amplifier and variable-gain amplifier as adjustment control signals; and a plurality of demodulators for demodulating an adjustment result of said adjustment circuit respectively for a plurality of modulation schemes, said control circuit comprising:

a scaling circuit for comparing the adjustment result with a predetermined target value and using a comparison result and a scaling coefficient to perform a scaling;

an adder for adding a scaling result of said scaling circuit to a delayed immediately preceding control voltage to generate a control voltage; and a control signal generator, comprising a timing generator for generating an update-timing signal, for generating the low-noise amplification control signal and the variable-gain amplification control signal from the control voltage in response to the update-timing signal, said scaling circuit determining a first scaling coefficient for a positive value and a second scaling coefficient for a negative value as the scaling coefficient according to each of the plurality of modulation schemes, determining a sign of the comparison result, using the first scaling coefficient for operation when the sign is positive and the second scaling coefficient for operation when the sign is negative.

2. The automatic gain control circuit according to claim 1, wherein during a predetermined stop period after the update-timing signal is generated, said adder stops addition and generates the control voltage only from the scaling result.

3. The automatic gain control circuit according to claim 1, wherein said control signal generator comprises:

a storage for storing the control voltage and for outputting the control voltage in response to the update timing;

a comparator for comparing the control voltage output from said storage with a predetermined comparison value to generate the low-noise amplification control signal;

a decision circuit for deciding the low-noise amplification control signal and for outputting a first operation coefficient according to a decision result; and an operation circuit for subtracting the first operation coefficient from the control voltage which is output from said storage to calculate out the variable-gain amplification control signal.

4. The automatic gain control circuit according to claim 3, wherein said comparator turns ON the low-noise amplification control signal when the control voltage output from said storage is equal to or more than the predetermined comparison value, and otherwise turns OFF the low-noise amplification control signal, said decision circuit outputting the predetermined comparison value as the first operation coefficient when the low-noise amplification control signal is in its ON state, and outputting data indicating zero as the first operation coefficient when the low-noise amplification control signal is in its OFF state.

5. The automatic gain control circuit according to claim 3, wherein said comparator comprises a filter for using the control voltage output from said storage and the delayed immediately-preceding filter result to perform filtering, said comparator comparing a filtering result of said filter with the predetermined comparison value and generating the low-noise amplification control signal.

6. The automatic gain control circuit according to claim 5, wherein said filter is an IIR (Infinite Impulse Response) filter.

7. The automatic gain control circuit according to claim 6, wherein said IIR filter stops an IIR filtering during a predetermined filtering-stop period set by an upper layer from when said timing generator starts to generate the update-timing signal.

8. The automatic gain control circuit according to claim 5, wherein said comparator comprises a hysteresis circuit for using a filtering result of said filter, an upper-limit threshold value and a lower-limit threshold value to perform hysteresis processing on the low-noise amplification control signal.

9. The automatic gain control circuit according to claim 8, wherein said hysteresis circuit stops the hysteresis processing during a predetermined hysteresis processing stop period set by an upper layer from when said timing generator starts to generate the update-timing signal.

10. The automatic gain control circuit according to claim 9, wherein said hysteresis circuit turns ON the low-noise amplification control signal and outputs it, when the low-noise amplification control signal is in its OFF state and the filtering result exceeds the upper-limit threshold value, said hysteresis circuit turning OFF the low-noise amplification control signal and outputting it, when the low-noise amplification control signal is in its ON state and the filtering result of said filter is lower than the lower-limit threshold value, and, otherwise, said hysteresis circuit directly outputting the low-noise amplification control signal.

11. The automatic gain control circuit according to claim 8, wherein said control signal generator comprises a compensator for determining a change between the low-noise amplification control signal output from said hysteresis circuit and a delayed immediately-preceding low-noise amplification control signal, and for outputting a second operation coefficient according to a determination result, said operation circuit subtracting the first operation coefficient from and adding the second operation coefficient to the control voltage output from said storage, and calculating out the variable-gain amplification control signal.

12. The automatic gain control circuit according to claim 11, wherein said compensator outputs as the second operation coefficient predetermined compensation data when the low-noise amplification control signal is changed from in its ON state to its OFF state, and otherwise data indicating zero.

13. The automatic gain control circuit according to claim 1, further comprising:

a demodulator power-supply management circuit for controlling power supply of said plurality of demodulators;

an RSSI signal decision circuit for determining an RSSI (Receiving Signal Strength Indicator) signal provided from said low-noise amplifier using a predetermined expected value, and for generating an RSSI decision signal indicating whether or not the RSSI signal detected is equal to or more than the predetermined expected value; and an AGC setting control circuit for determining an AGC (Automatic Gain Control) setting corresponding to any one of said plurality of demodulators, and controlling said timing generator and said demodulator power-supply management circuit according to the AGC setting, and for generating a timing generation control signal according to the RSSI decision signal, and controlling said timing generator in response to the timing generation control signal, said timing generator generating an update-timing signal according to the timing generation control signal and the AGC setting, said timing generator generating, only when said RSSI signal decision circuit detects the RSSI signal equal to or more than the predetermined expected value, the update-timing signal of a fixed-cycle signal according to the modulation scheme of the demodulator corresponding to the AGC setting to output it.

14. The automatic gain control circuit according to claim 13, wherein said AGC setting control circuit provides an addition-stop period to said timing generator, said timing generator generating the addition-stop signal for stopping the addition during the addition-stop period after the update-timing signal is generated, and providing it to said adder, said adder stopping the addition in response to the addition-stop signal.

15. The automatic gain control circuit according to claim 13, wherein when the RSSI signal is equal to or more than the predetermined expected value, said RSSI signal decision circuit turns ON the RSSI decision signal and outputs it to said AGC setting control circuit, and, otherwise, said RSSI signal decision circuit turns OFF the RSSI decision signal and outputs it to said AGC setting control circuit, said AGC setting control circuit, when the RSSI decision signal is in its ON state, turning ON the timing generation control signal and providing the symbol time and symbol number to said timing generator as the AGC setting, said AGC setting control circuit, when the RSSI decision signal is in its OFF state, turning OFF the timing generation control signal and providing the symbol time and symbol number to said timing generator as the AGC setting, said timing generator performing, when the timing generation control signal is in its ON state, integration on a reference operational clock signal for a number of symbols at a time interval according to a symbol time to generate the update-timing signal, said timing generator stopping, when the timing generation control signal is in its OFF state, generation of the update-timing signal.

16. The automatic gain control circuit according to claim 15, wherein said AGC setting control circuit determines an AGC setting which provides finite or infinite generation of the update-timing signal corresponding to any one of said plurality of demodulators, said AGC setting control circuit determining, when providing finite generation, the AGC setting as a finite AGC setting which includes a finite symbol number and a symbol time for said corresponding demodulator, said AGC setting control circuit determining, when providing infinite generation, the AGC setting as an infinite AGC setting which includes a symbol number indicating an infinite value, and an average of finite symbol times for said plurality of demodulators or a finite symbol time for any one of said plurality of demodulators.

17. The automatic gain control circuit according to claim 16, wherein said AGC setting control circuit determines the AGC setting according to a plurality of demodulation modes respectively corresponding to said plurality of demodulators, and according to a plurality of pieces of synchronous information and asynchronous information provided from said plurality of demodulators.

18. The automatic gain control circuit according to claim 13, wherein said RSSI signal decision circuit comprises an error decision circuit for turning ON error information according to a setting from the upper layer and for providing it to said AGC setting control circuit, when said timing generator starts to generate the update-timing signal and the synchronous information is provided from all of said plurality of demodulators, said error decision circuit forcefully turning ON the error information according to the setting from the upper layer, said AGC setting control circuit determining the AGC setting which provides an infinite generation of the update-timing signal only when the error information is in its ON state.

19. The automatic gain control circuit according to claim 18, wherein said error decision circuit turns OFF the error information and provides it to said AGC setting control circuit, when an energy value obtained by averaging of the RSSI signal is less than a predetermined threshold value, and, otherwise, said error decision circuit decides an error, turns ON the error information, and provides it to said AGC setting control circuit, said AGC setting control circuit determining the AGC setting as the infinite AGC setting only when the error information is in its ON state.

20. The automatic gain control circuit according to claim 18, wherein said scaling circuit comprises a condition setting circuit for changing the predetermined target value and the scaling coefficient, according to the plurality of demodulation modes and the error information provided from said AGC setting control circuit.

* * * * *